(12) United States Patent
Weidner et al.

(10) Patent No.: US 6,841,514 B2
(45) Date of Patent: Jan. 11, 2005

(54) THERMAL TRANSFER IMAGING ELEMENT CONTAINING INFRARED BICHROMOPHORIC COLORANT

(75) Inventors: Charles H. Weidner, Ontario, NY (US); Ruizheng Wang, Rohester, NY (US); Linda A. Kaszczuk, Webster, NY (US); Glenn T. Pearce, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 69 days.

(21) Appl. No.: 10/329,911

(22) Filed: Dec. 26, 2002

(65) Prior Publication Data

US 2004/0127359 A1 Jul. 1, 2004

(51) Int. Cl.[7] .................................................. B41M 5/30
(52) U.S. Cl. .................... 503/227; 428/32.6; 428/32.76
(58) Field of Search ................................ 503/217, 218, 503/219, 220, 222, 223, 224, 227, 221; 428/32.6, 32.76

(56) References Cited

U.S. PATENT DOCUMENTS

| | | | |
|---|---|---|---|
| 4,950,639 A | 8/1990 | DeBoer et al. ............. 503/227 |
| 5,106,815 A | * | 4/1992 | Akada et al. ................ 503/227 |
| 5,139,997 A | * | 8/1992 | Bach et al. .................. 503/227 |
| 5,223,476 A | * | 6/1993 | Kanto et al. ................. 503/227 |
| 5,281,572 A | * | 1/1994 | Bach et al. .................. 503/227 |
| 5,843,617 A | | 12/1998 | Patel et al. |
| 5,972,838 A | | 10/1999 | Pierce et al. ................. 503/227 |
| 6,602,648 B2 | | 8/2003 | Nakamura ............... 430/270.1 |
| 6,623,908 B2 | | 9/2003 | Zheng et al. ............. 430/270.1 |
| 2002/0028404 A1 | | 3/2002 | Nakamura |

FOREIGN PATENT DOCUMENTS

| | | |
|---|---|---|
| EP | 0 499 822 | 8/1992 |
| EP | 0 675 003 | 4/1995 |
| EP | 0747 700 | 12/1996 |

* cited by examiner

Primary Examiner—Bruce H. Hess
(74) Attorney, Agent, or Firm—Arthur E. Kluegel; Kathleen Neuner Manne

(57) ABSTRACT

Disclosed is an imaging element comprising a bichromophoric molecule comprising a first chromophore that exhibits a first absorption maximum above 700 nm and a second chromophore that exhibits a second absorption maximum different from the first absorption maximum, wherein the absorption of the first and second chromophores are substantially independent of each other, and a process for imaging using such a donor element. Elements of the invention eliminate unwanted absorptions in the final image.

15 Claims, No Drawings

THERMAL TRANSFER IMAGING ELEMENT CONTAINING INFRARED BICHROMOPHORIC COLORANT

CROSS-REFERENCE TO RELATED APPLICATIONS

This application is cofiled with commonly assigned application U.S. Ser. No. 10/329,912 which describes and claims colorants useful herein.

FIELD OF THE INVENTION

This invention relates to a imaging element used in laser-induced thermal imaging containing a bichromophoric molecule having a first chromophore with maximum absorption at a wavelength above 700 nm and an independent second chromophore having a maximum absorption at a wavelength different than the first absorption maximum. Elements of the invention eliminate unwanted absorptions in the final image.

BACKGROUND OF THE INVENTION

In order to approximate the appearance of continuous tone (photographic) images via ink-on-paper printing, the commercial printing industry relies on the process known as halftone printing. In halftone printing, color density gradations are produced by printing patterns of dots or areas of varying sizes, but of the same color density, instead of varying the color density continuously as is done in photographic printing.

There is an important commercial need to obtain a color proof image before a printing press run is made. It is desired that the color proof will accurately represent at least the details and color tone scale of the prints obtained from the printing press. In many cases, it is also desirable that the color proof accurately represent the image quality and halftone pattern of the prints obtained on the printing press. In the sequence of operations necessary to produce an ink-printed, full color picture, a proof is also required to check the accuracy of the color separation data from which the final three or more printing plates or cylinders are made. Traditionally, such color separations proofs have involved silver halide light-sensitive systems which require many exposure and processing steps before a final, full color picture is assembled.

In U.S. Pat. No. 5,126,760, a process is described for producing a direct digital, halftone color proof of an original image on a colorant-receiving element. The proof can then be used to represent a printed color image obtained from a printing press. The process described therein comprises:

a) generating a set of electrical signals which is representative of the shape and color scale of an original image;

b) contacting a colorant-donor element comprising a support having thereon a colorant layer and an infrared-absorbing material with a first colorant-receiving element comprising a support having thereon a polymeric, colorant image-receiving layer;

c) using the signals to image-wise heat by means of a diode laser the colorant-donor element, thereby transferring a colorant image to the first colorant-receiving element; and d) retransferring the colorant image to a second colorant image-receiving element which has the same substrate as the printed color image. In the above process, multiple colorant-donors are used to obtain a complete range of colors in the proof. For example, for a full color proof, four colors—cyan, magenta, yellow and black are normally used.

By using the above process, the image colorant is transferred by heating the colorant-donor containing the infrared-absorbing material with the diode laser to volatilize the colorant, the diode laser beam being modulated by the set of signals which is representative of the shape and color of the original image, so that the colorant is heated to cause volatilization only in those areas in which its presence is required on the colorant-receiving layer to reconstruct the original image.

In some instances, laser exposure of the donor element can result in the transfer of not only the desired colorant, but also that of the infrared absorbing material. If the infrared absorbing material has some visible absorption, this unwanted transfer can result in degraded color quality of the digital halftone image. It is common knowledge in the art to minimize the visible absorption of the infrared absorbing material through structural modification, thereby moderating the color degradation due to unwanted transfer of the infrared absorbing material. Another approach which is taught in EP 675003, U.S. Pat. No. 5,843,617, and related art is the use of a chemical agent capable of bleaching the infrared absorbing material to a visibly colorless state so it no longer degrades the desired colorimetry of the transferred image.

It has been found that the use of an infrared absorbing material which has a secondary, visible absorbance in the same spectral region as the visible colorant image transferred during laser thermal imaging, provides images displaying an improved color match and better saturation of color than images generated from donor elements in which the infrared absorber contributes to unwanted absorption. Thus, an infrared absorber with a lambda max>800 nm, and a secondary absorption peaking between 400 and 500 nm can provide images with excellent color fidelity of the newly generated image from a yellow donor. Likewise, the same infrared absorber as described in the previous sentence can be used in a magenta donor because the magenta image, and magenta printing inks in general, have significant absorption between 400–500 nm. These will be called color-matched examples of the invention, whereas examples in which the secondary visible absorption lies in a region outside the range of absorption of the transferred colorant, leading to degradation of image color, will be referred to as color-mismatched.

Similarly, using a thermal head in place of a diode laser as described in U.S. Pat. No. 4,923,846 can generate a thermal transfer proof. Commonly available thermal heads are not capable of generating halftone images of adequate resolution, but can produce high quality continuous tone proof images, which are satisfactory in many instances. U.S. Pat. No. 4,923,846 also discloses the choice of mixtures of colorants for use in thermal imaging proofing systems. Inkjet is also used as a low cost proofing method as described in U.S. Pat. No. 6,022,440. Likewise, an inkjet proof can be generated using combinations of either dispersed colorants in an aqueous fluid, or dissolved colorants in a solvent based system. U.S. Pat. No. 6,352,330 discloses methods for accomplishing this. Ink jet printers can also produce high quality continuous tone proof images, which by virtue of their cost are satisfactory in many instances. The colorants are selected on the basis of values for hue error and turbidity. The Graphic Arts Technical Foundation Research Report No. 38, "Color Material" (58-(5) 293–301, 1985) gives an account of this method.

An alternative and more precise method for color measurement and analysis uses the concept of uniform color space known as CIELAB, in which a sample is analyzed mathematically in terms of its spectrophotometric curve, the nature of the illuminant under which it is viewed, and the color vision of a standard observer. For a discussion of CIELAB and color measurement, see *Principles of Color Technology*, $2^{nd}$ Edition, F. W. Billmeyer, pp.25–110, Wiley Interscience and *Optical Radiation Measurements*, Volume 2, F. Grum, pp. 33–145, Academic Press.

In using CIELAB, colors can be expressed in terms of three parameters: L*, a*, and b*, where L* is a lightness function, and a* and b* define a point in color space. Thus, a plot of a* versus b* values for a color sample can be used to accurately show where that sample lies in color space, i.e., what its hue is. This allows different samples to be compared for hue if they have similar density and L* values.

The colorants described in this invention have the following general formula:

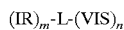

$(IR)_m$-L-$(VIS)_n$ wherein:

L represents the non-chromophoric portions of the molecule and does not conjugate the first and second chromophores;

each IR chromophore independently represents a chromophore with λ-max above 700 nm;

each VIS chromophore independently represents a visible chromophore with λ-max from 400–700; and m and n are independently 1–6.

The visible chromophore can exhibit a λ-max in the range of 400–500 nm, in the range of 500–600 nm, or in the range of 600–700 nm.

The visible chromophore can be selected from yellow, cyan, and magenta. According to various embodiments, at least one visible chromophore can contain a pyrazoloazo group, a phenylazo group, a pyrazolodione group, an azoledione group, a pyrazolone group, a phenylamino group, a pyridinone group, an anilino group, a propene group, a cyclohexamine group, or a thiazoleazo group.

In color proofing in the printing industry, it is important to be able to match the proofing ink references provided by the International Prepress Proofing Association. In the United States, these ink references are density patches made with standard 4-color process inks and are known as SWOP® (Specifications Web Offset Publications) color aims. In 1995, ANSI CGATS TR 001-1995 was published which is becoming the standard in the United States industry. For additional information on color measurement of inks for web offset proofing, see "Advances in Printing Science and Technology", Proceedings of the $19^{th}$ International Conference of Printing Research Institutes, Eisenstadt, Austria, June 1987, J. T Ling and R. Warner, p.55.

It is desirable to provide proofs which can be used in parts of the world which do not use the SWOP® aims. For example, in Japan, a different standard is used and it would be desirable to provide a closer match to Japan Color. The 2001 Japan Color/Color Sample colorimetry values currently under consideration by the Japan National Committee for ISO/TC130 were used as the color reference.

It is a problem to be solved to provide a laser induced colorant donor element that employs an IR colorant that exhibits improved color matching.

SUMMARY OF THE INVENTION

The invention provides a laser imaging colorant donor element containing a colorant molecule comprising a first chromophore having an absorption maximum at a wavelength above 700 nm and a second chromophore having an absorption maximum different than the first maximum absorption. The invention also provides a process for imaging using such a donor element. A preferred embodiment of this invention has the second absorption maximum below 700 nm, and more specifically, between 400–700 nm.

Elements of the invention eliminate unwanted absorptions in the final image.

DETAILED DESCRIPTION OF THE INVENTION

As used herein, the term "colorant" refers to a compound such as a dye or pigment that absorbs electromagnetic radiation in the visible or non-visible spectrum and the term "chromophore" refers to the portion or portions of the compound that perform the absorption function in the visible or non-visible region of the spectrum. They may be used in any desired form such as solutions, dispersions, or suspensions. The infrared absorbers of the present invention are bichromophoric colorant molecules which may be derived by combining, in a covalent and non-spectrally interacting independent manner, such as where the first and second chromophores are not linked by a conjugated chain, a first colorant molecule having a maximum absorption in the IR region above 700 nm and a second colorant molecule having a different maximum absorption, typically in the visible region of 400–700 nm.

The colorants described in this invention have the following formula I:

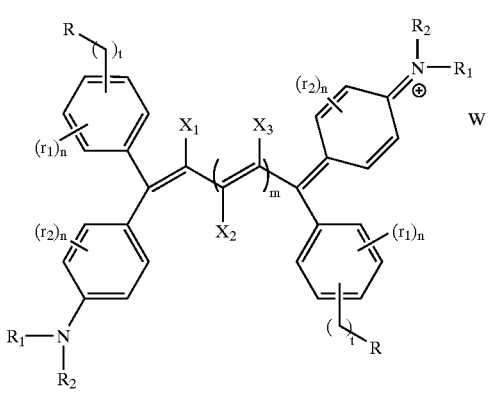

wherein:

each R independently represents hydrogen or a substituent with at least one such group being a colored chromophore, the colored chromophores include, but not limited to, the following colored chromophores: yellow, cyan, or magenta;

$X_1$, $X_2$ and $X_3$ each independently represents hydrogen, halogen, cyano, an alkyl group having 1 to 12 carbon atoms, a cycloalkyl group having 5 to 10 carbon atoms in the carbocyclic ring, an aryl group having 6 to 10 carbon atoms in the carbocyclic ring, or any two of said $X_1$, $X_2$, and $X_3$ may be joined together to complete a 5- to 7-membered carbocyclic or heterocyclic ring group, and m is 1–3;

Each of $R_1$, and $R_2$ independently represents an alkyl group having 1 to 12 carbon atoms a cycloalkyl group having 5 to 10 carbon atoms in the carbocyclic ring, an aryl group having 6 to 10 carbon atoms in the carbocyclic ring, or a heterocyclic or polymeric backbone group; provided $R_1$ and $R_2$ may be joined together to form a 5- to 7-membered heterocyclic ring group;

each of $r_1$, $r_2$, and $r_3$ independently represents a substituent group, each n is 0–4, and each t is 0–4; and W is a monovalent counter anion to balance the charge on the colorant.

In a preferred embodiment of the invention, the infrared colorant comprising a polymethine colorant described in this invention has m=1, and t=0, 1. Suitably, the colorant has the following formula:

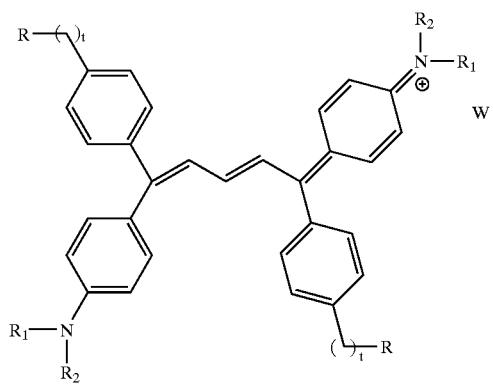

Examples of infrared colorants within the above formula include, but are not limited to, the following compounds:

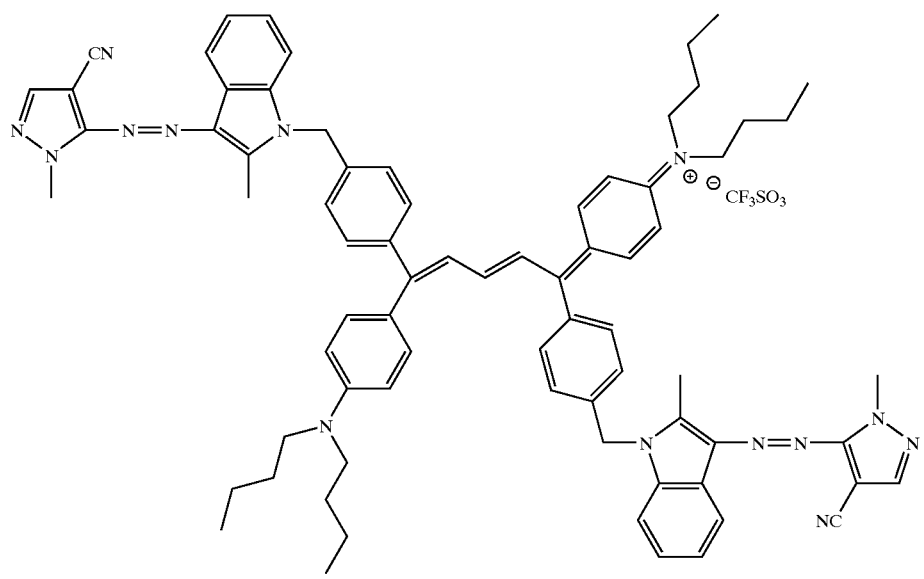

Colorant 1 ($\lambda_{max1}$ = 420 nm; $\lambda_{max2}$ = 864 nm)

-continued
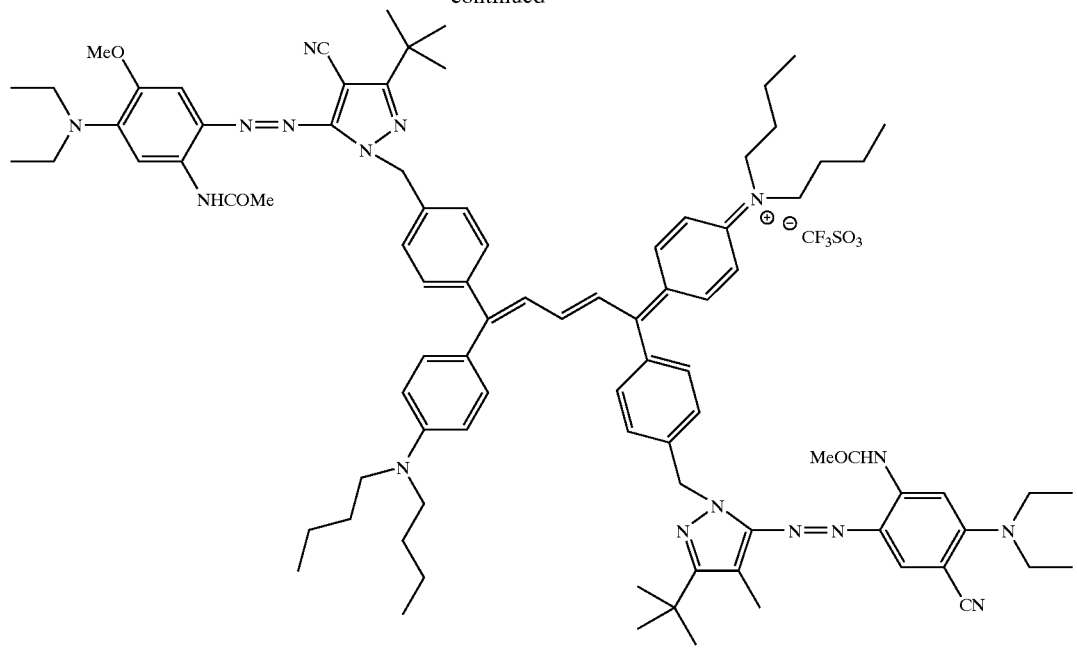
Colorant 2 (λ_max1 = 540 nm; λ_max2 = 575 nm; λ_max3 = 858 nm)
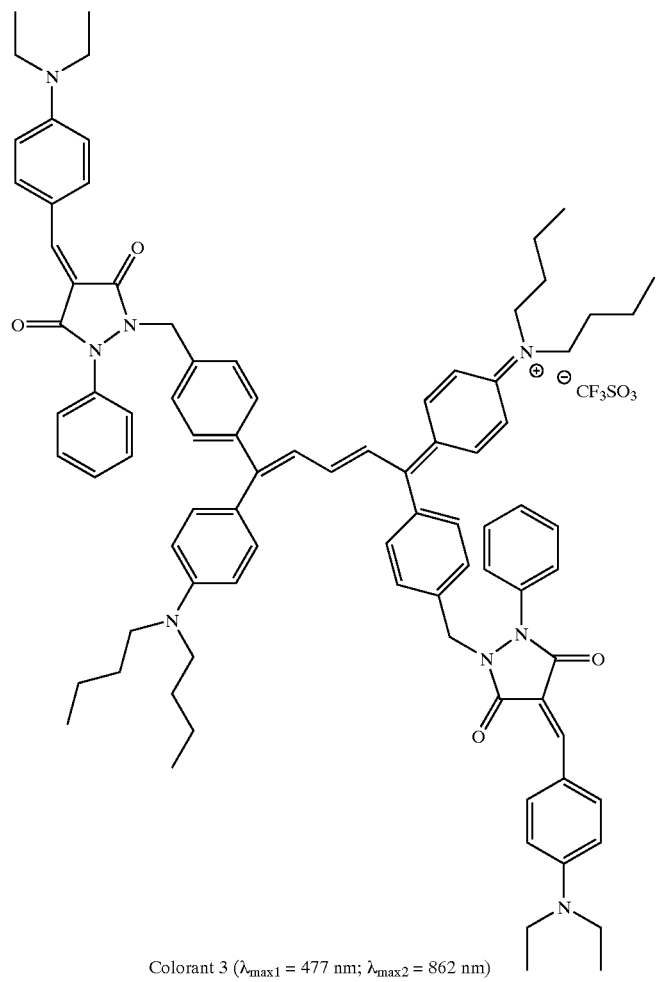
Colorant 3 (λ_max1 = 477 nm; λ_max2 = 862 nm)

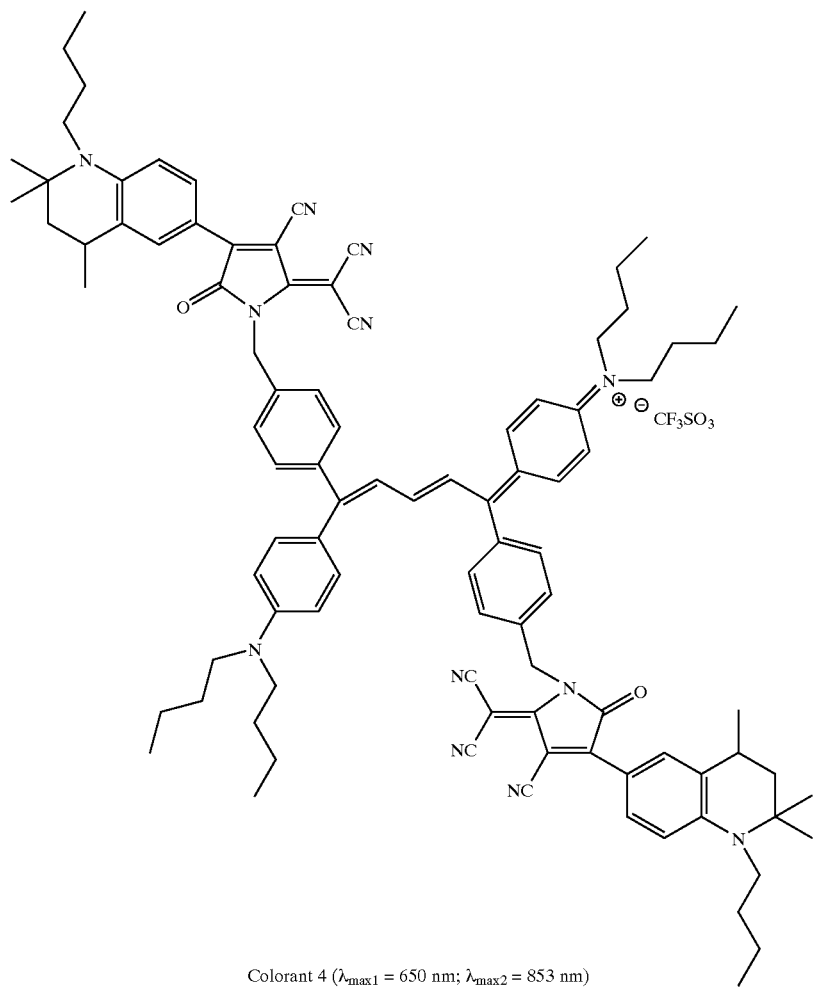
Colorant 4 ($\lambda_{max1}$ = 650 nm; $\lambda_{max2}$ = 853 nm)
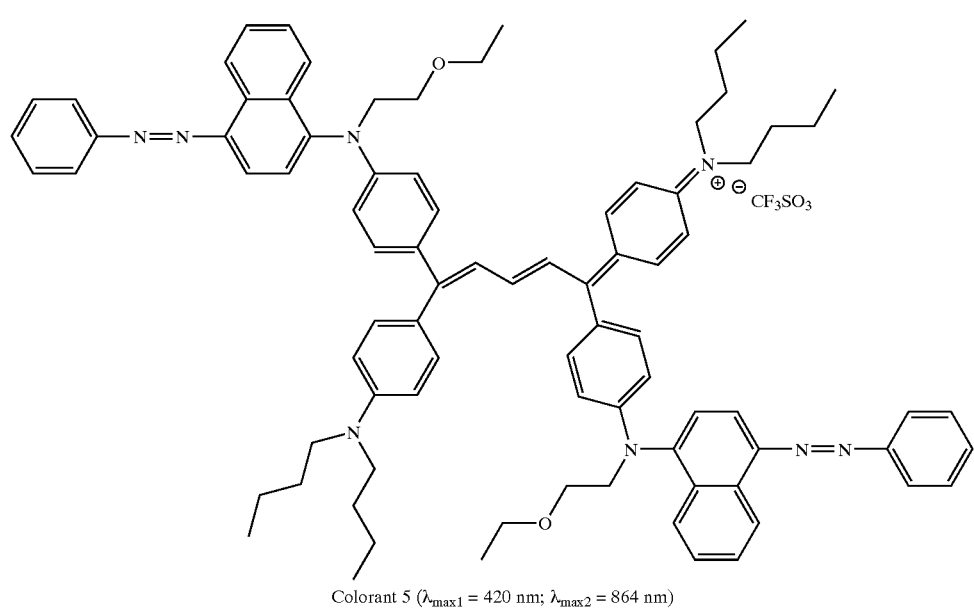
Colorant 5 ($\lambda_{max1}$ = 420 nm; $\lambda_{max2}$ = 864 nm)

-continued
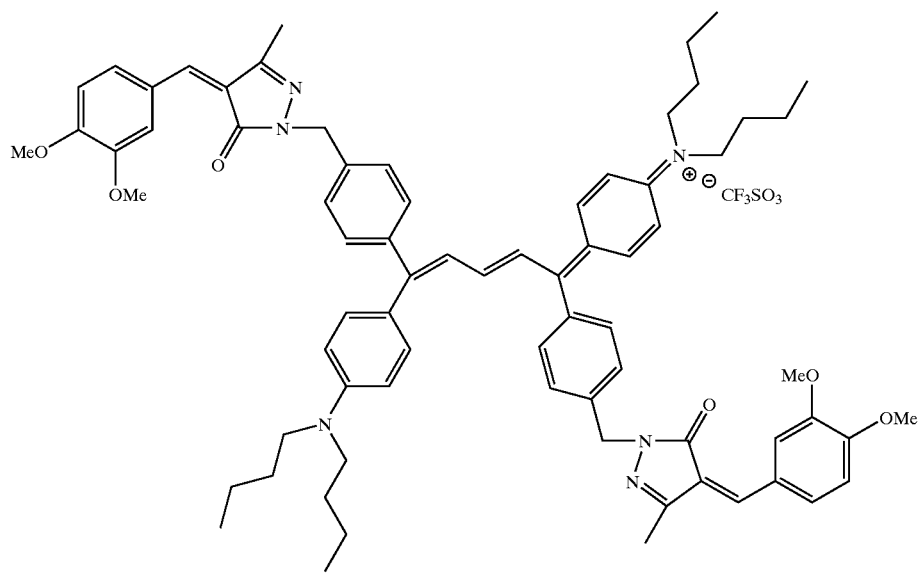
Colorant 6 (λ$_{max1}$ = 380 nm; λ$_{max2}$ = 861 nm)
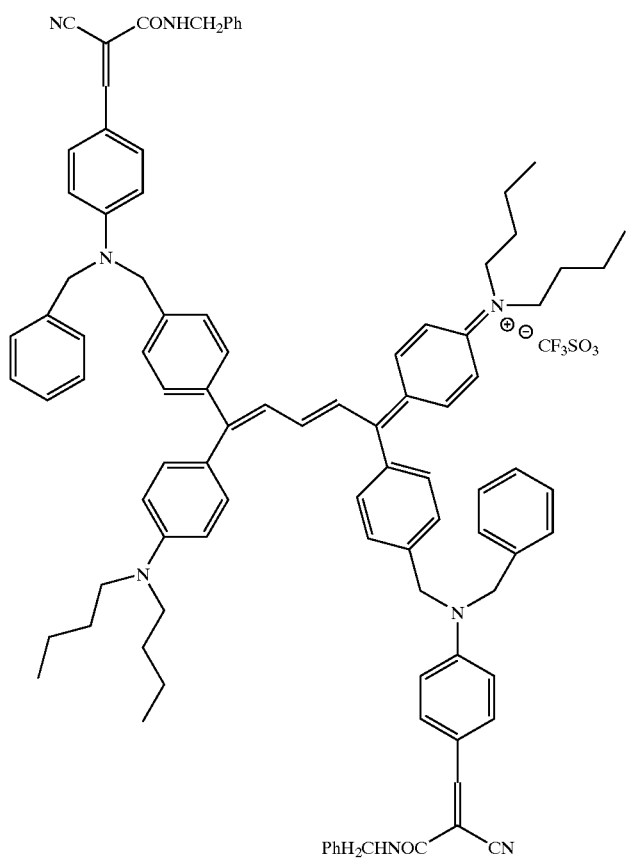
Colorant 7 (λ$_{max1}$ = 400 nm; λ$_{max2}$ = 864 nm)

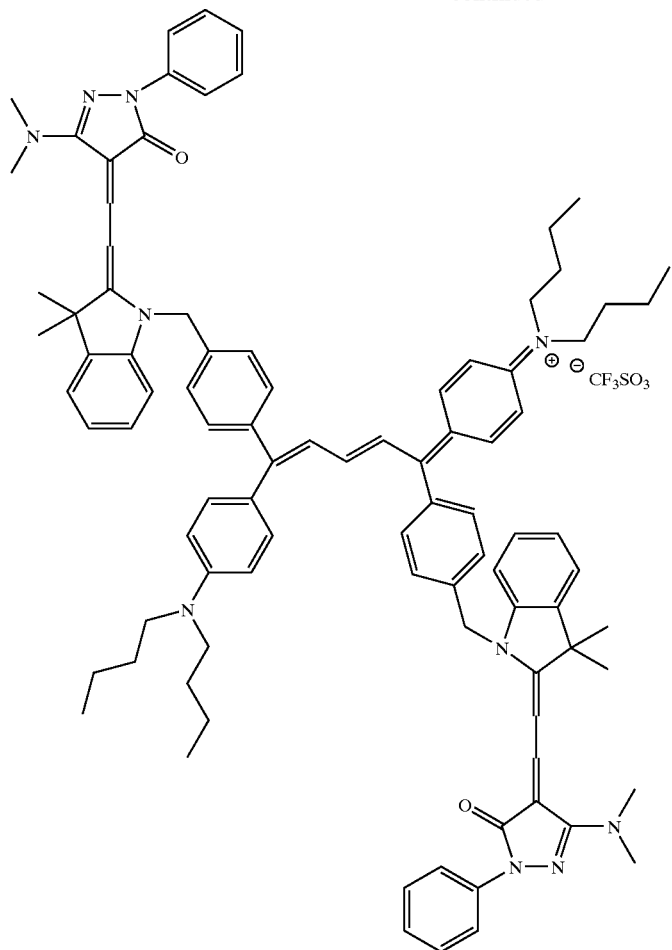
Colorant 8 (λ_max1 = 460 nm; λ_max2 = 863 nm)
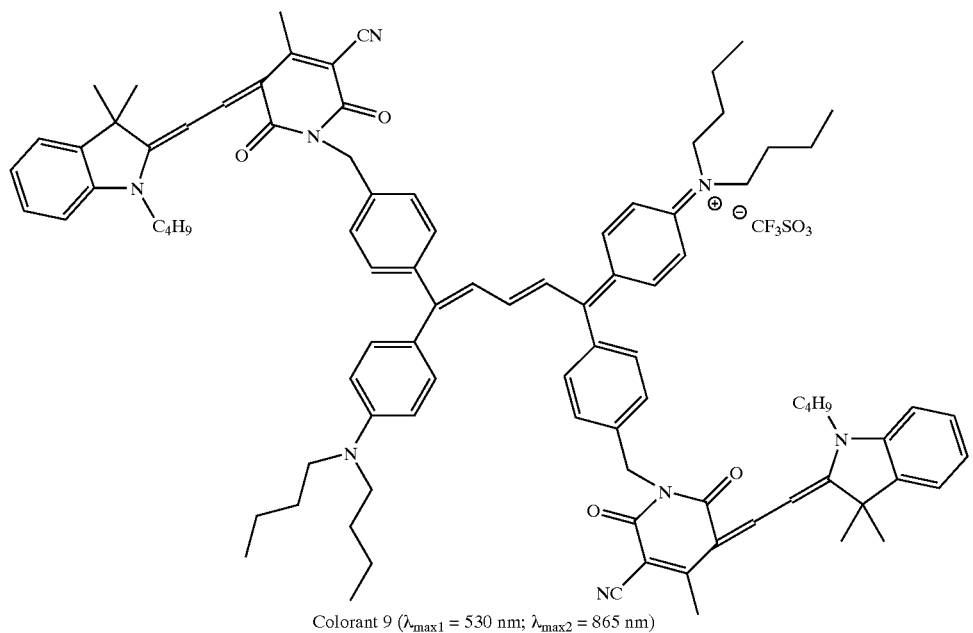
Colorant 9 (λ_max1 = 530 nm; λ_max2 = 865 nm)

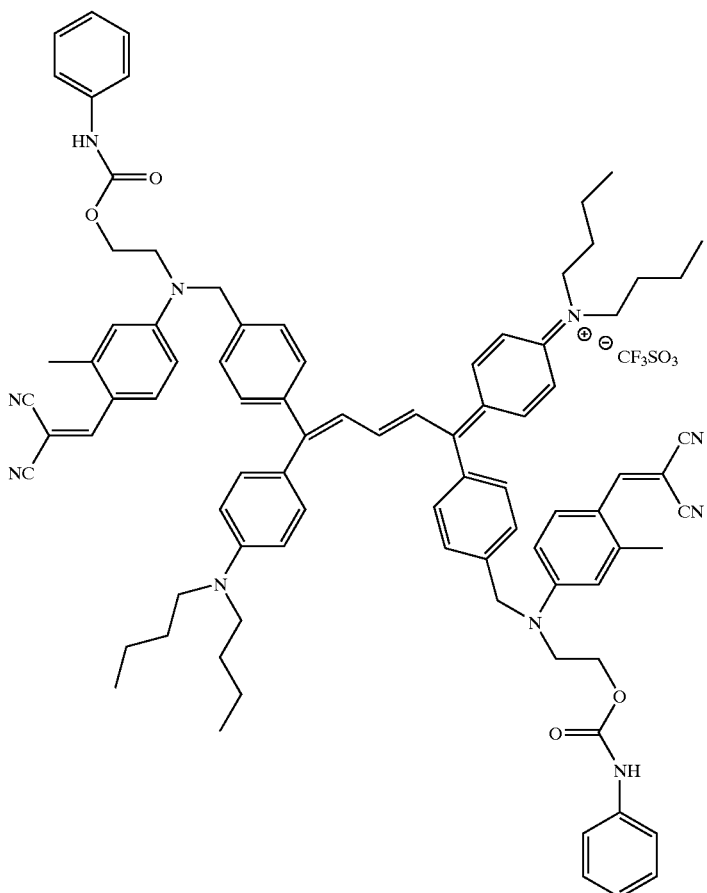
Colorant 10 (λ_max1 = 440 nm; λ_max2 = 863 nm)
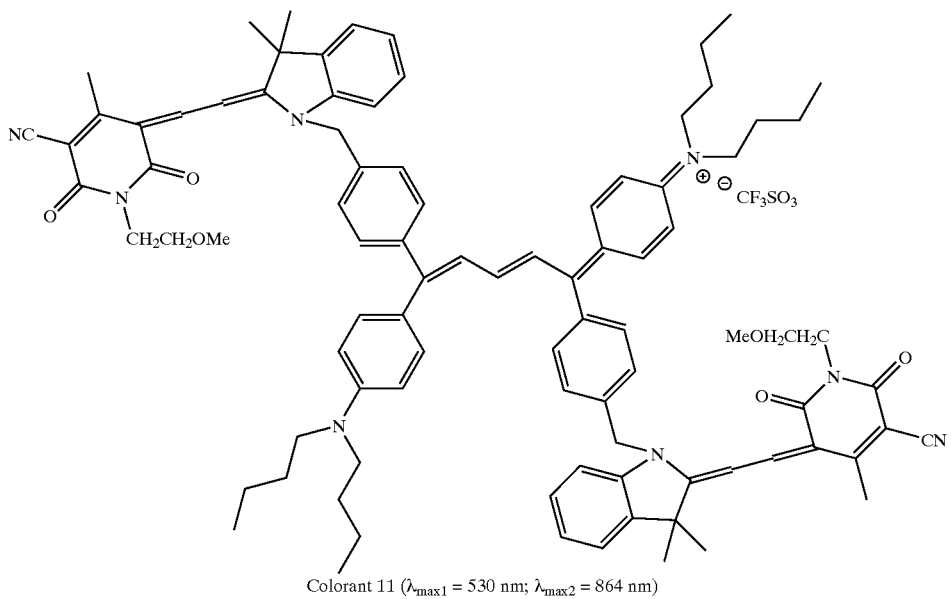
Colorant 11 (λ_max1 = 530 nm; λ_max2 = 864 nm)

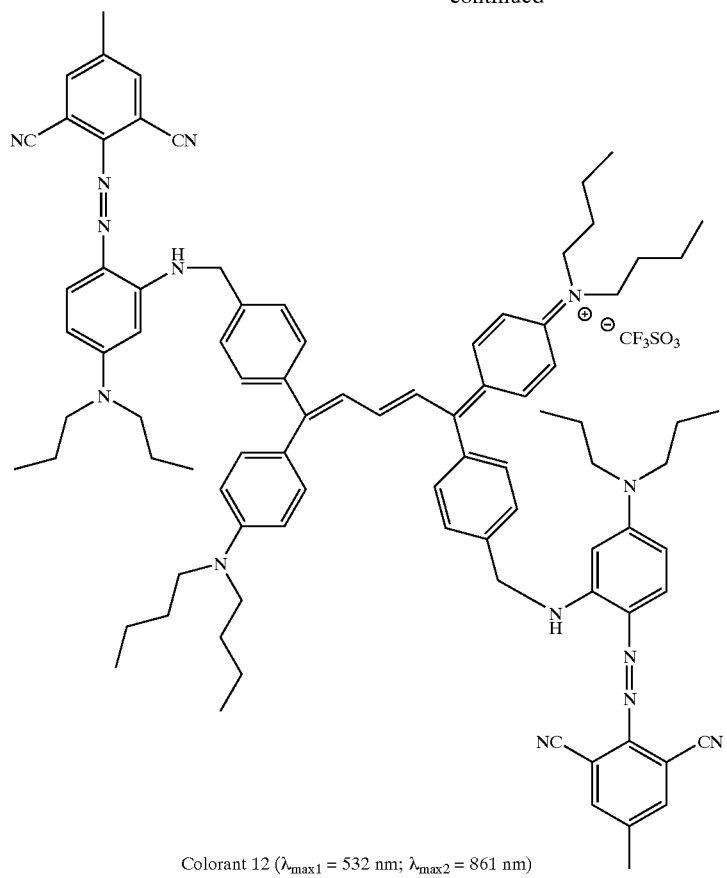
Colorant 12 (λ_max1 = 532 nm; λ_max2 = 861 nm)
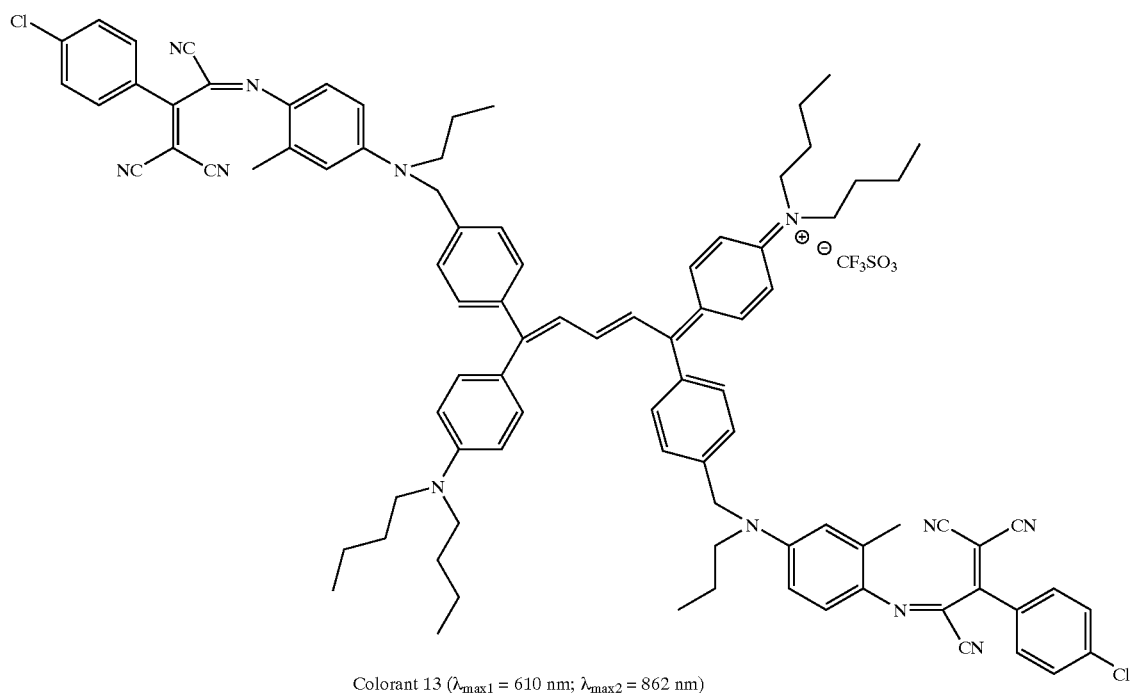
Colorant 13 (λ_max1 = 610 nm; λ_max2 = 862 nm)

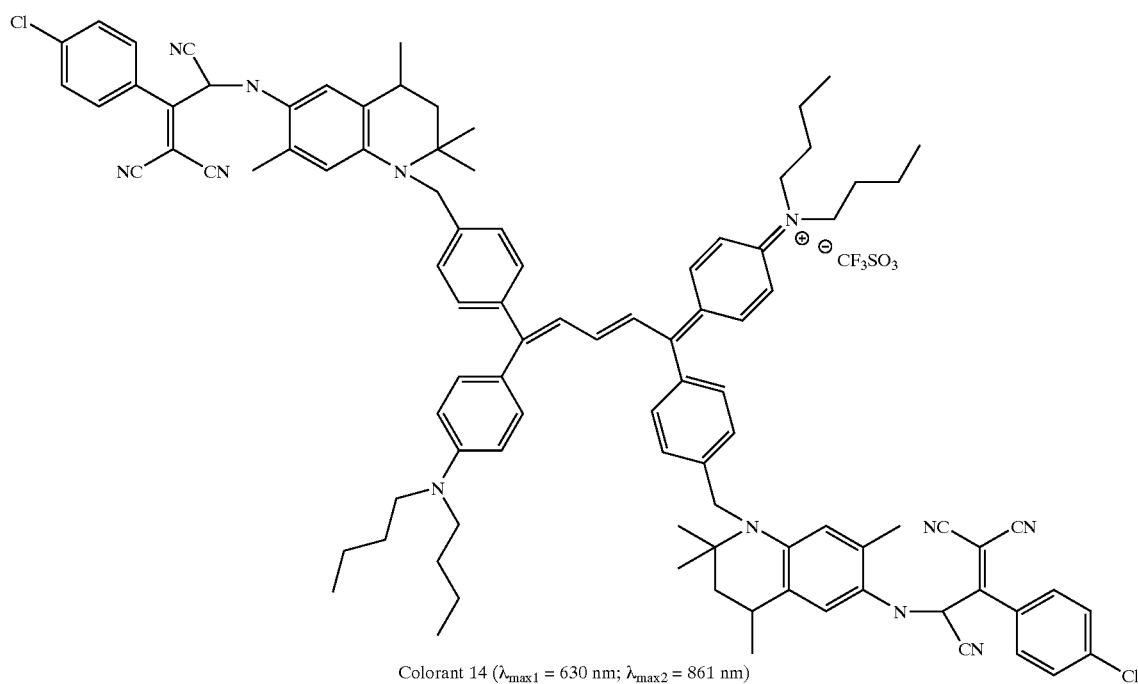
Colorant 14 (λ_max1 = 630 nm; λ_max2 = 861 nm)
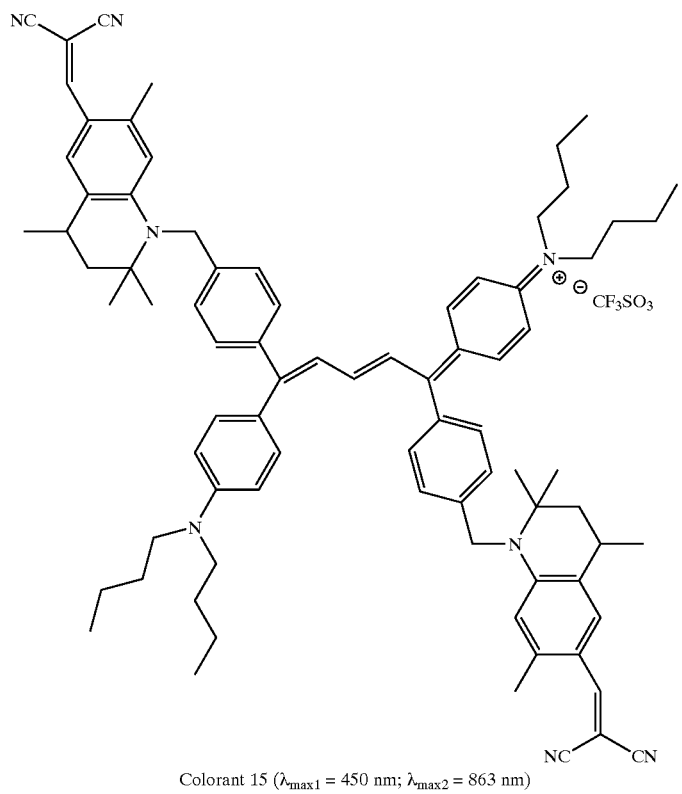
Colorant 15 (λ_max1 = 450 nm; λ_max2 = 863 nm)

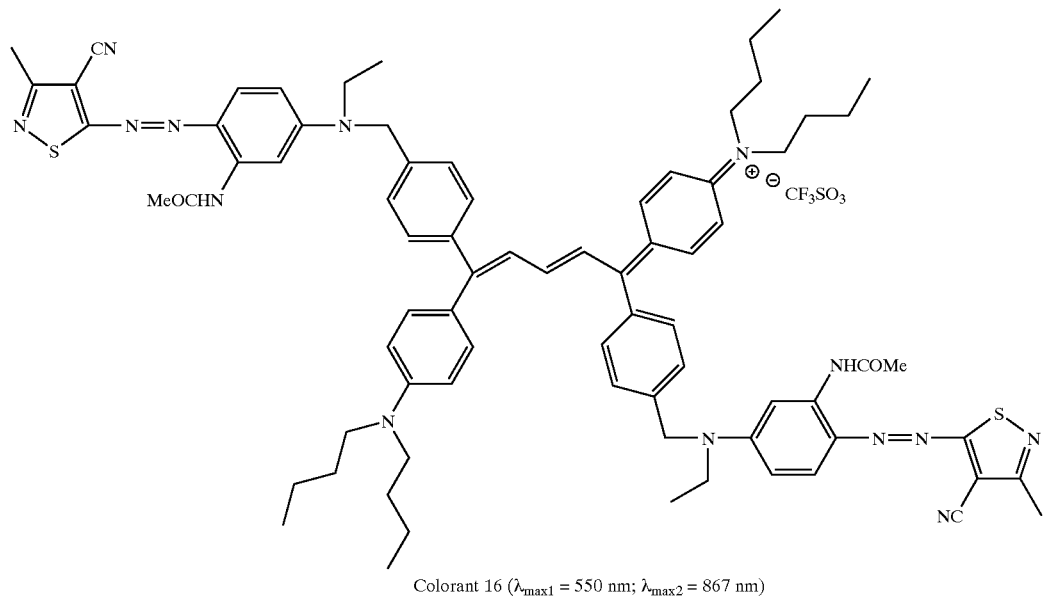
Colorant 16 ($\lambda_{max1}$ = 550 nm; $\lambda_{max2}$ = 867 nm)
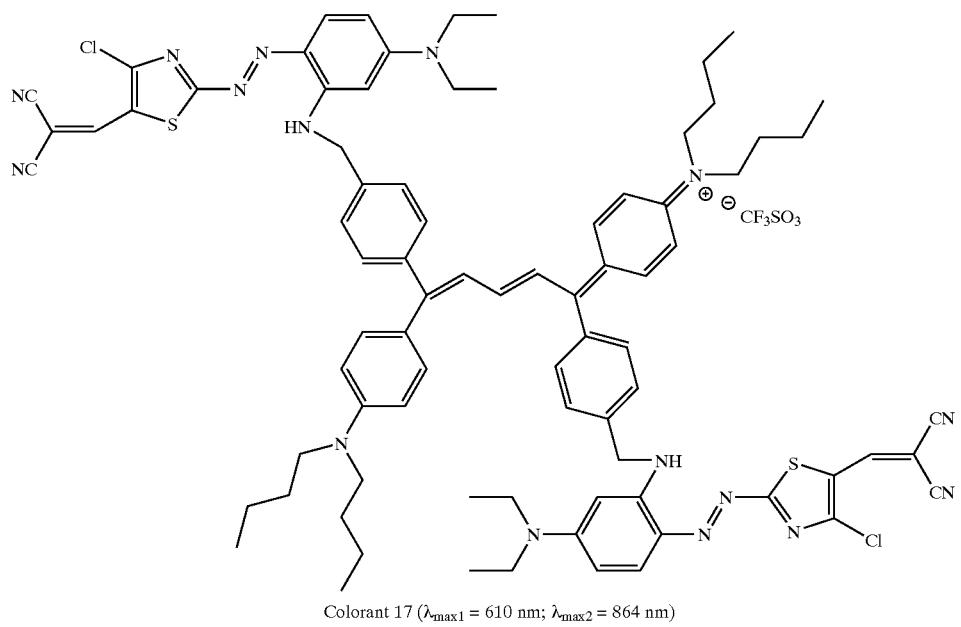
Colorant 17 ($\lambda_{max1}$ = 610 nm; $\lambda_{max2}$ = 864 nm)

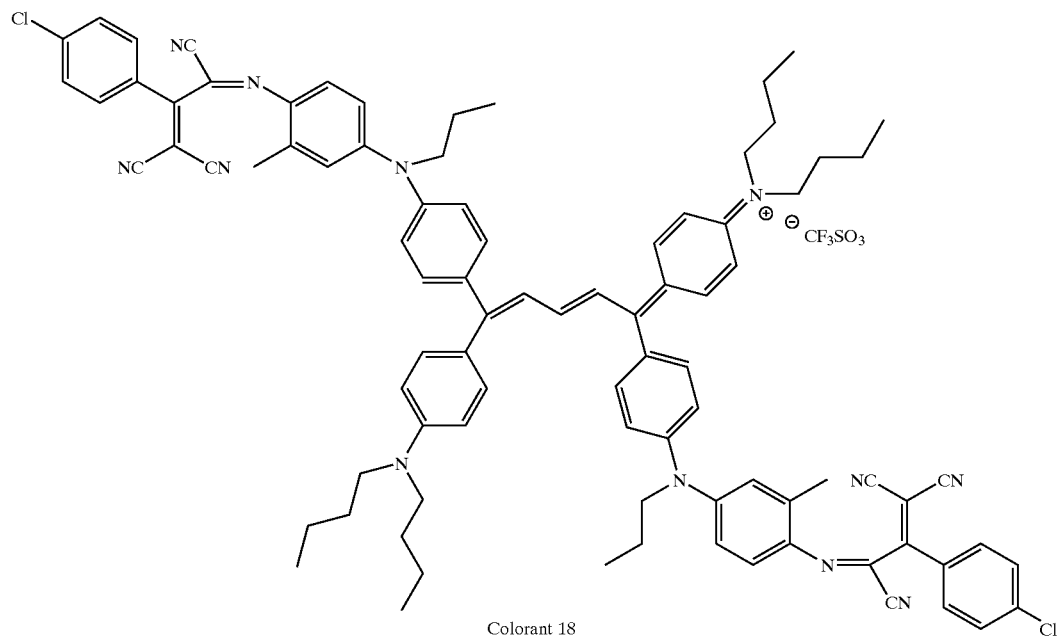
Colorant 18
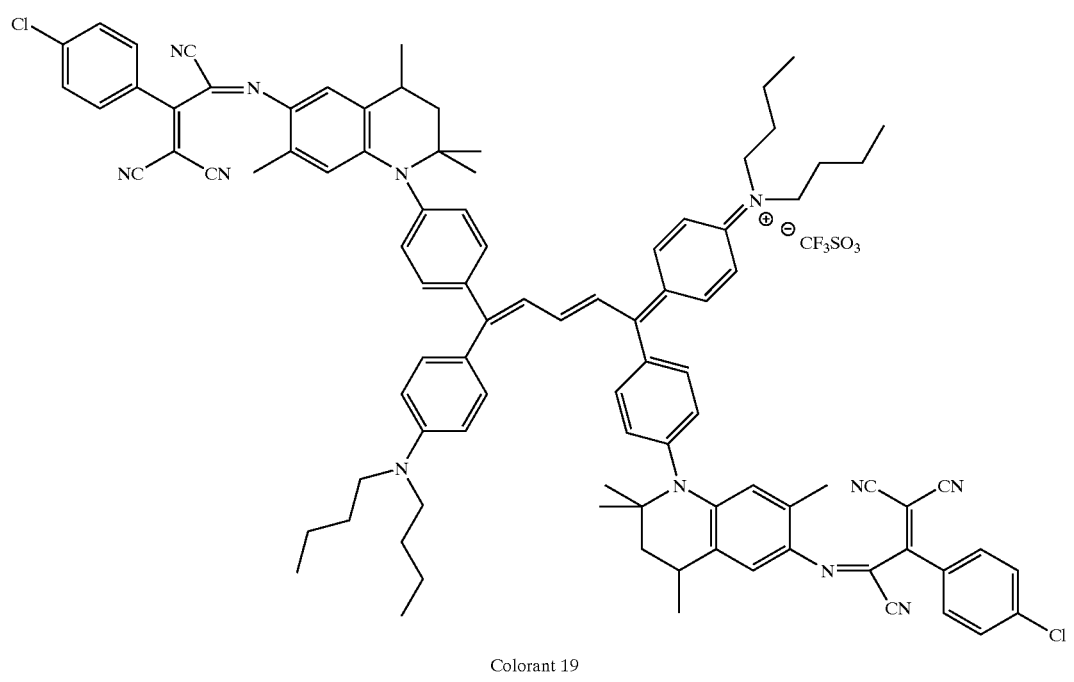
Colorant 19

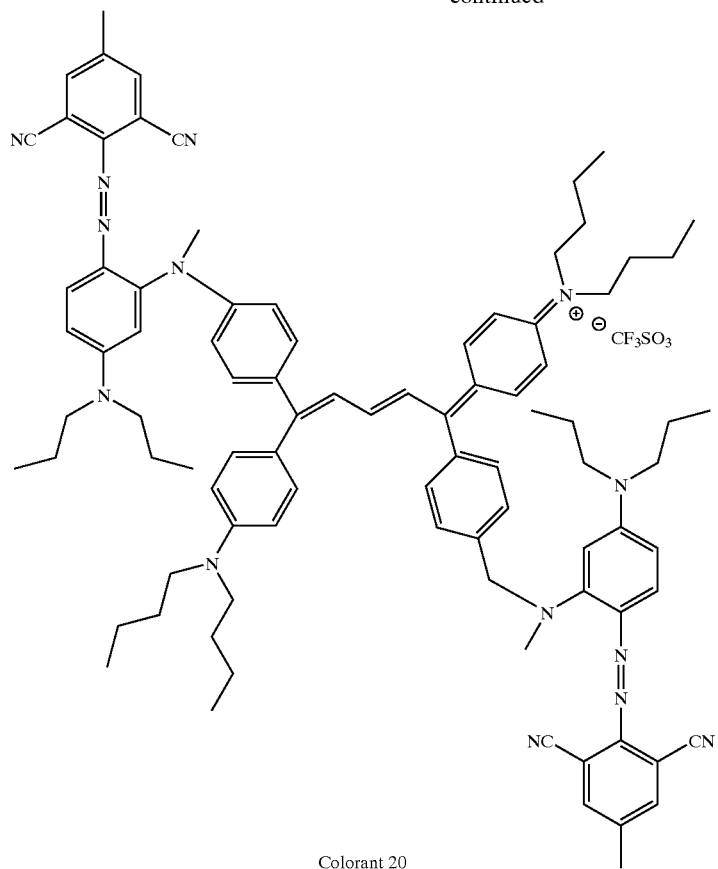
Colorant 20
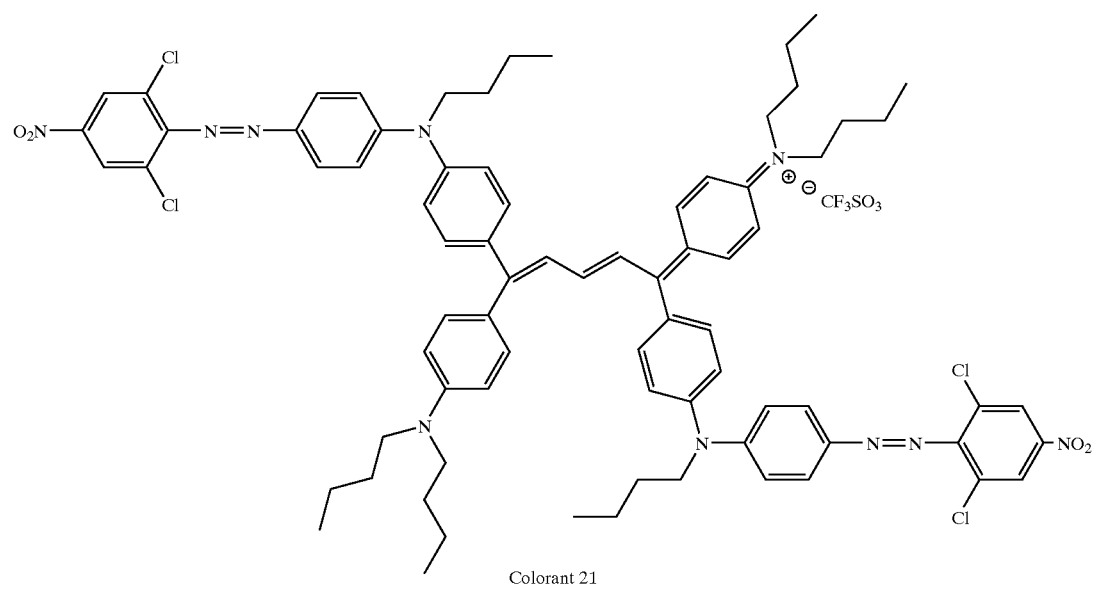
Colorant 21

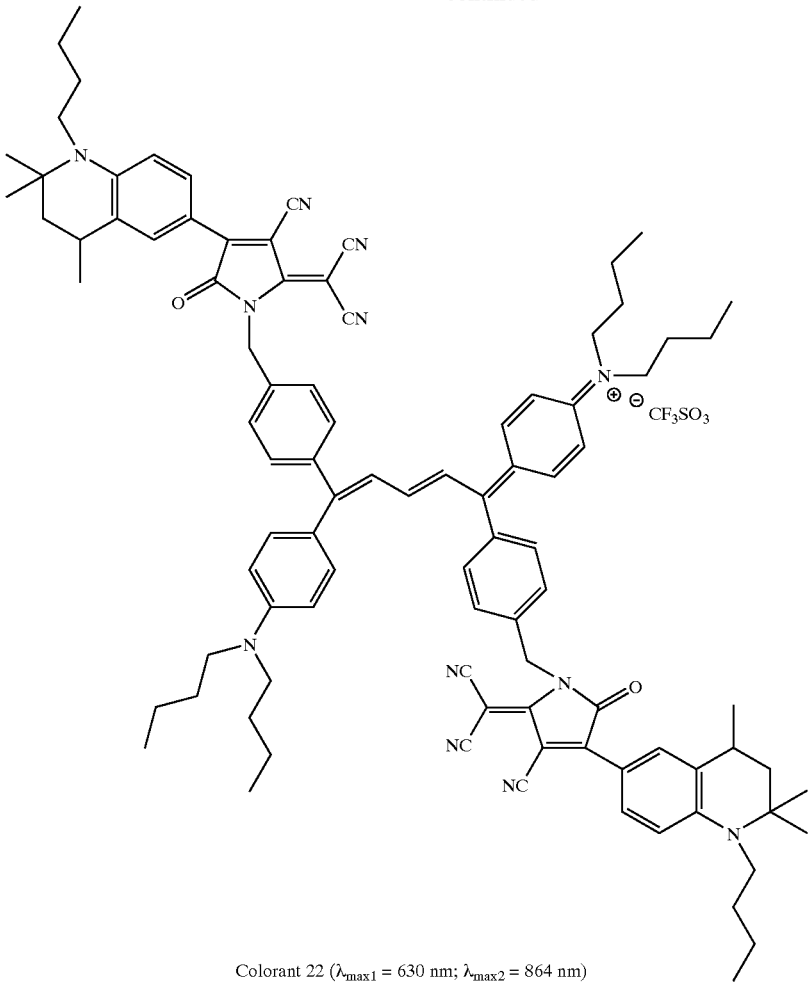

Colorant 22 ($\lambda_{max1}$ = 630 nm; $\lambda_{max2}$ = 864 nm)

Image colorants useful for the invention can include any visible colorants such as dyes and pigments that can be transferred using thermal energy produced by a laser or a thermal head. Examples of useful yellow colorants include, but are not limited to, the following:

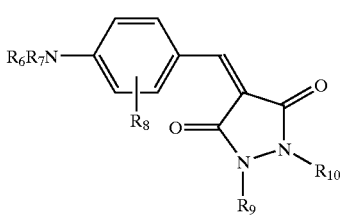

II wherein:

$R_6$ is an alkyl or allyl group of from 1 to 6 carbon atoms, such as methyl, ethyl, propyl, isopropyl, butyl, pentyl, allyl, but-2-en-1-yl, 1,1-dichloropropen-3-yl, or such alkyl or allyl groups substituted with groups such as hydroxy, acyloxy, alkoxy, aryl, carboxy, carbalkoxy, cyano, acylamido, halogen, and phenyl;

$R_7$ is any of the groups as described for $R_6$, or represents the atoms which when taken together with $R_8$ forms a 5- or 6-membered ring;

$R_8$ is an alkyl or alkoxy group of from 1 to 6 carbon atoms, or represents the atoms which when taken together with $R_7$ forms a 5- or 6-membered ring group; and $R_9$ and $R_{10}$ are each an alkyl group of 1–6 carbon atoms, or an aryl group of from about 6 to 10 carbon atoms such as phenyl, naphthyl, p-tolyl, m-chlorophenyl, p-methoxyphenyl, m-bromophenyl, and o-tolyl groups.

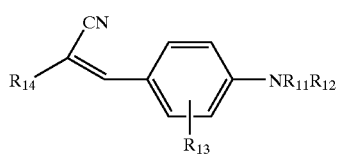

III wherein:

$R_{11}$ is an alkyl or allyl group of from 1 to 6 carbon atoms, such as methyl, ethyl, propyl, isopropyl, butyl, pentyl, allyl, but-2-en-1-yl, 1,1-dichloropropen-3-yl, or such alkyl or allyl groups substituted with substituents such as hydroxy, acyloxy, alkoxy, aryl, carboxy, carbalkoxy, cyano, acylamido, halogen, and phenyl groups;

$R_{12}$ is any of the groups as described for $R_{11}$, or represents the atoms which when taken together with $R_{13}$ form a 5- or 6-membered ring group;

$R_{13}$ is an alkyl or alkoxy of from 1 to 6 carbon atoms, or represents the atoms which when taken together with $R_{12}$ form a 5- or 6-membered ring group;

$R_{14}$ is cyano, $C(O)OR_{15}$ or $—CONR_{15}R_{16}$, where $R_{15}$ and $R_{16}$ each independently represents an alkyl group having from 1 to 6 carbon atoms; a cycloalkyl group of from 5 to 7 carbon atoms; an allyl group; an aryl group of from 6 to 10 carbon atoms such as phenyl, naphthyl, p-tolyl, m-chlorophenyl, p-methoxyphenyl, m-bromophenyl, and o-tolyl; or a heteroaryl group of from 5 to 10 atoms, such as 2-thienyl, 2-pyridyl, or 2-furyl.

In some embodiments, the combination can include an additional colorant of formula IV:

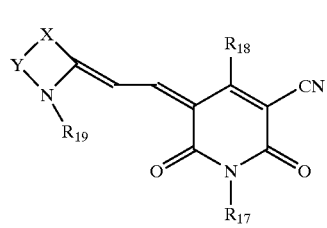

IV wherein:

$R_{17}$, $R_{18}$, and $R_{19}$ each independently represents an alkyl group having from 1 to 10 carbon atoms; a cycloalkyl group of from 5 to 7 carbon atoms; an allyl group; an aryl group of from 6 to 10 carbon atoms such as phenyl, naphthyl, p-tolyl, m-chlorophenyl, p-methoxyphenyl, m-bromophenyl, and o-tolyl; or a heteroaryl group of from 5 to 10 atoms, such as 2-thienyl, 2-pyridyl, or 2-furyl;

X represents $C(CH_3)_2$, S, O, or $NR_{17}$.

Examples of useful magenta colorants include, but are not limited to, materials having the formula V or VI:

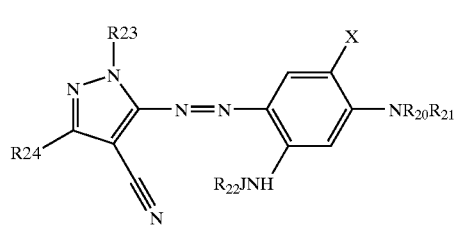

V wherein:

$R_{20}$ is an alkyl or allyl group of from 1 to about 6 carbon atoms, such as methyl, ethyl, propyl, isopropyl, butyl, pentyl, allyl, but-2-en-1-yl, 1,1-dichloropropen-3-yl, including such alkyl or allyl groups substituted with groups such as hydroxy, acyloxy, alkoxy, aryl, carboxy, carbalkoxy, cyano, acylamido, halogen;

X is an alkoxy group of from 1 to about 4 carbon atoms or represents the atoms when taken together with $R_2$ forms a 5- or 6-membered ring;

$R_{21}$ is any of the groups as described for $R_{20}$ or represents the atoms which when taken together with X forms a 5- or 6-membered ring;

$R_{22}$ is an alkyl group of from 1 to 6 carbon atoms such as those listed above for $R_{20}$, or an aryl group of from about 6 to 10 carbon atoms such as phenyl, naphthyl, p-tolyl, m-chlorophenyl, p-methoxyphenyl, m-bromophenyl, and o-tolyl groups;

J is CO, $CO_2$, $SO_2$, or $CONR_{24}$;

$R_{23}$ is an alkyl or allyl group of from 1 to 6 carbon atoms, such as those listed above for $R_1$, or an aryl group of from 6 to 10 carbon atoms such as those listed above for $R_{22}$; and $R_{24}$ is hydrogen, an alkyl or allyl group of from 1 to 6 carbon atoms, such as those listed above for $R_{20}$, or an aryl group of from 6 to 10 carbon atoms such as those listed above for $R_{22}$.

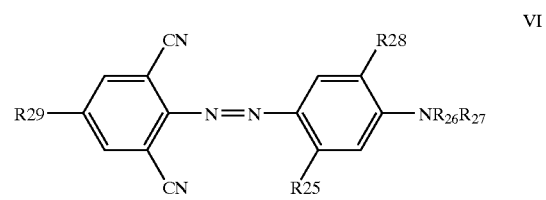

VI wherein:

$R_{25}$ is a substituted or unsubstituted alkyl group having from about 1 to 4 carbon atoms, an alkoxy group having from 1 to about 4 carbon atoms, an alkylcarbonamido group having from 1 to about 6 carbon atoms, or an alkylsulfonamido group having from 1 to about 8 carbon atoms;

$R_{26}$ and $R_{27}$ each individually represent a substituted or unsubstituted aryl group having from 6 to about 10 carbon atoms, a substituted or unsubstituted alkyl group having from 1 to about 5 carbon atoms, an alkoxyalkyl group having from 3 to about 8 carbon atoms, an aralkyl group having from about 7 to about 10 carbon atoms or a hydroxyalkyl group having from about 2 to about 5 carbon atoms;

$R_{28}$ is hydrogen, halogen, an alkoxy group having from 1 to about 4 carbon atoms or may be taken together with $R_{26}$ or $R_{27}$ to form a 5- or 6-membered heterocyclic ring; and $R_{29}$ is hydrogen, a substituted or unsubstituted alkyl group having from 1 to about 8 carbon atoms or an alkoxy group having from 1 to about 4 carbon atoms.

Examples of useful cyan colorants include, but are not limited to, materials having the formula VII, VIII or IX:

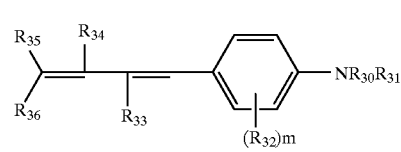

VII wherein:

$R_{30}$ and $R_{31}$ each independently represents hydrogen; a substituted or unsubstituted alkyl group having from 1 to about 6 carbon atoms; a substituted or unsubstituted cycloalkyl group having from about 5 to about 7 carbon atoms; a substituted or unsubstituted allyl group;

or R₃₀ and R₃₁ can be joined together to form, along with the nitrogen to which they are attached, a 5- to 7-membered heterocyclic ring such as morpholine or pyrrolidine;

or either or both of R₃₀ and R₃₁ can be combined with R₃₂ to form a 5- to 7-membered heterocyclic ring;

each R₃₂ independently represents substituted or unsubstituted alky, cycloalkyl or allyl as described above for R₃₀ and R₃₁; alkoxy, aryloxy, halogen, thiocyano, acylamido, ureido, alkylsulfonamido, arylsulfonamido, alkylthio, arylthio or trifluoromethyl;

or any two of R₃₂ may be combined together to form a 5- or 6-membered carbocyclic or heterocyclic ring;

or one or two of R₃₂ may be combined with either or both of R₃₀ and R₃₁ to complete a 5- to 7-membered ring;

m is an integer of from 0 to 4;

R₃₃ represents an electron-withdrawing substituent such as cyano, alkoxycarbonyl, aminocarbonyl, alkylsulfonyl, arylsulfonyl, acyl, nitro, etc.;

R₃₄ represents a substituted or unsubstituted aryl group having from about 6 to about 10 carbon atoms; a substituted or unsubstituted hetaryl group having from about 5 to about 10 atoms;

R₃₅ and R₃₆ each independently represents an electron-withdrawing such as those described for R₃₃; or R₃₅ and R₃₆ may be combined to form the residue of an active methylene compound such as pyrazolin-5-one, a pyrazoline-3,5-dione, a thiohydantoin, a barbituric acid, a rhodanine, a furanone, an indandione, etc.

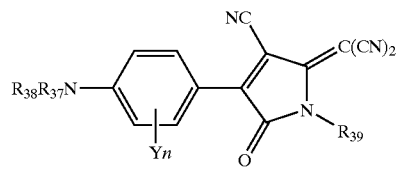

VIII wherein:

R₃₇ and R₃₈ each independently represents hydrogen; a substituted or unsubstituted alkyl group having from 1 to about 8 carbon atoms; a substituted or unsubstituted cycloalkyl group having from about 5 to about 8 carbon atoms; or a substituted or unsubstituted alkenyl group having from about 2 to about 8 carbon atoms; or R₃₇ and R₃₈ may represent the elements which may be taken together to form a 5- or 6-membered heterocyclic ring, such as pyrazole, pyrrolidine or piperazine;

each Y independently represents hydrogen; a substituted or unsubstituted alkyl group having from 1 to about 8 carbon atoms; an alkoxy group such as OR₃₇; halogen; or two adjacent Y's may represent the atoms—which may be taken together to form a fused carbocyclic aromatic ring such as naphthalene;

N is an integer of from 0 to 4;

the position of Y ortho to the nitrogen may also be combined with R₃₇ to form a 5- to 6-membered non-aromatic, single or double nitrogen-containing, heterocyclic ring such as tetrahydroquinoline, dihydroquinoline, indoline, etc.; and R₃₉ is a substituted or unsubstituted alkyl group having from 1 to about 8 carbon atoms; a substituted or unsubstituted allyl group having from 3 to about 6 carbon atoms; an acyl group having from 2 to about 9 substituted or unsubstituted carbon atoms; a substituted or unsubstituted aroyl group having from about 7 to about 18 carbon atoms; or a substituted or unsubstituted heteroaroyl group having from about 6 to about 12 atoms.

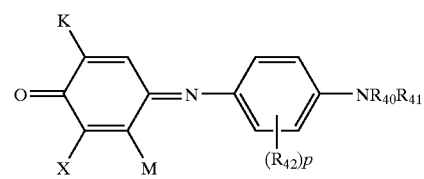

IX wherein:

R₄₀ and R₄₁ each independently represents hydrogen; a substituted or unsubstituted alkyl group having from 1 to about 6 carbon atoms; a substituted or unsubstituted cycloalkyl group having from about 5 to about 7 carbon atoms; a substituted or unsubstituted allyl group;

or R₄₀ and R₄₁ can be joined together to form, along with the nitrogen to which they are attached, a 5- to 7-membered heterocyclic ring such as morpholine or pyrrolidine;

or either or both of R₄₀ and R₄₁ can be combined with R₄₂ to form a 5- to 7-membered heterocyclic ring;

each R₄₂ independently represents substituted or unsubstituted alky, cycloalkyl or allyl as described above for R₄₀ and R₄₁; alkoxy, aryloxy, halogen, thiocyano, acylamido, ureido, alkylsulfonamido, arylsulfonamido, alkylthio, arylthio or trifluoromethyl;

or any two of R₄₂ may be combined together to form a 5- or 6-membered carbocyclic or heterocyclic ring;

or one or two of R₄₂ may be combined with either or both of R₄₀ and R₄₁ to complete a 5- to 7-membered ring;

p is an integer of from 0 to 4;

X represents hydrogen, halogen or may be combined together with M to represent the atoms necessary to complete a 6-membered aromatic ring, thus forming a fused bicyclic quinoneimine, such as naphthoquinoneimine; with the proviso that when X is hydrogen, then K represents NHCOR_f, where R_f represents a perfluorinated alkyl or aryl group; and with the further proviso that when X is halogen, then K represents NHCOR₄₃, NHCO₂ R₄₃, NHCONH R₄₃ or NHSO₂ R₄₃; and with the further proviso that when X is combined with M, then K represents CONH R₄₃, SO₂NH R₄₃, CN, SO₂ R₄₃ or SCN, in which case, however, R₄₃ cannot be hydrogen;

R₄₃ is the same as R₄₀ and R₄₁ as described above; and

M is R₄₃, acylamino or may be combined together with X as described above.

Useful yellow colorants within the scope of formula II include the following:

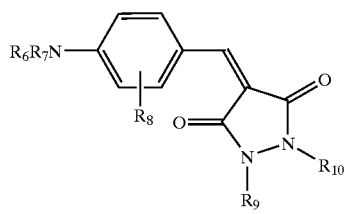

II

| Colorant | $R_6$ | $R_7$ | $R_8$ | $R_9$ | $R_{10}$ |
|---|---|---|---|---|---|
| IIa | $C_2H_5$ | $C_2H_5$ | H | $C_6H_5$ | $C_2H_5$ |
| IIb | $C_2H_5$ | —$C(CH_3)_2CH_2CH(CH_3)$— | | $C_6H_5$ | $C_2H_5$ |
| IIc | $CH_3$ | $CH_3$ | 2-$CH_3$ | $C_6H_5$ | $C_2H_5$ |
| IId | $CH_2C_6H_5$ | $CH_2C_6H_5$ | H | $C_6H_5$ | $C_2H_5$ |
| IIe | $C_2H_5$ | $C_2H_5$ | H | $C_6H_5$ | $C_4H_9$ |
| IIf | $C_2H_5$ | $C_2H_5$ | H | $C_6H_5$ | $CH_2CH=CH_2$ |
| IIg | $C_2H_5$ | $C_2H_5$ | H | $C_6H_5$ | $CH_2CH_2C(O)OCH_3$ |
| IIh | $C_2H_5$ | $C_2H_5$ | H | $C_6H_5$ | $CH_2C(O)OCH_2CH_3$ |

Useful yellow colorants within the scope of formula III include the following:

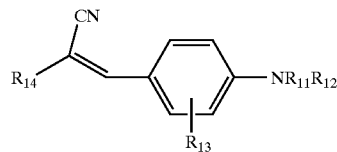

III

| Colorant | $R_{11}$ | $R_{12}$ | $R_{13}$ | $R_{14}$ |
|---|---|---|---|---|
| IIIa | $C_2H_5$ | $C_2H_5$ | H | CN |
| IIIb | $C_2H_5$ | $CH_2CH_2OC(O)NHC_6H_5$ | 3-$CH_3$ | CN |
| IIIc | $CH_2C_6H_5$ | $CH_2C_6H_5$ | H | CN |
| IIId | $C_2H_5$ | —$C(CH_3)_2CH_2CH(CH_3)$— | | CN |
| IIIe | $C_2H_5$ | $CH_2C_6H_5$ | H | CN |
| IIIf | $C_2H_5$ | $CH_2C_6H_5$ | H | $C(O)NHCH_2C_6H_5$ |
| IIIg | $C_2H_5$ | $C_2H_5$ | H | $C(O)NHCH_2C_6H_5$ |
| IIIh | $CH_2C_6H_5$ | $CH_2C_6H_5$ | H | $C(O)NHCH_2C_6H_5$ |
| IIIj | $CH_2C_6H_5$ | $CH_2C_6H_5$ | H | $C(O)N(C_2H_5)CH_2C_6H_5$ |
| IIIk | $C_2H_5$ | $C_2H_5$ | H | $C(O)OCH_2C_6H_5$ |
| IIIm | $C_2H_5$ | $C_2H_5$ | H | $C(O)OCH_2CH_3$ |
| IIIn | $CH_2C_6H_5$ | $CH_2C_6H_5$ | H | $C(O)OCH_2CH_3$ |
| IIIo | $C_2H_5$ | $CH_2C_6H_5$ | H | $C(O)OCH_2CH_3$ |
| IIIp | $CH_2C(O)OC_2H_5$ | $CH_2C(O)OC_2H_5$ | H | CN |

The above colorants and synthetic procedures for making these are disclosed in U.S. Pat. No. 3,247,211 and U.S. Pat. No. 5,081,101, the disclosure of which are hereby incorporated by reference.

Useful additional colorants within the scope of formula IV include the following:

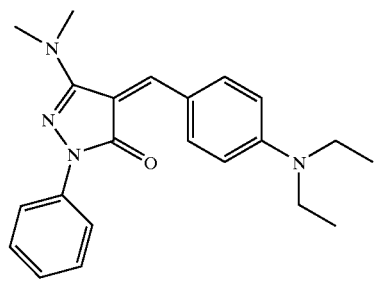

IV

| Colorant | $R_{17}$ | $R_{18}$ | $R_{19}$ | X | Y |
|---|---|---|---|---|---|
| IVa | $C_2H_5$ | $CH_3$ | $C_2H_5$ | S | $C_6H_4$ |
| IVb | $CH_2C_6H_5$ | $CH_3$ | $CH_3$ | S | $C_6H_4$ |
| IVc | $C_4H_9$ | $C_2H_5$ | $C_3H_7$ | $C(CH_3)_2$ | $C_6H_4$ |
| IVd | $C_2H_4OCH_3$ | $CH_3$ | $C_4H_9$ | $C(CH_3)_2$ | $C_6H_4$ |
| IVe | $C_4H_9$ | $C_2H_5$ | $C_4H_9$ | $C(CH_3)_2$ | $C_6H_4$ |
| IVf | $C_2H_4OC_2H_5$ | $CH_3$ | $C_2H_5$ | $C(CH_3)_2$ | $C_6H_4$ |
| IVc | $CH_2C_6H_5$ | $CH_3$ | $CH_3$ | $C(CH_3)_2$ | $C_6H_4$ |

The above colorants and synthetic procedures for making these are disclosed in JP 53/014734, the disclosure of which is hereby incorporated by reference.

In a preferred embodiment of the invention, the following additional yellow colorant, Y-1, may also be employed:

Y-1

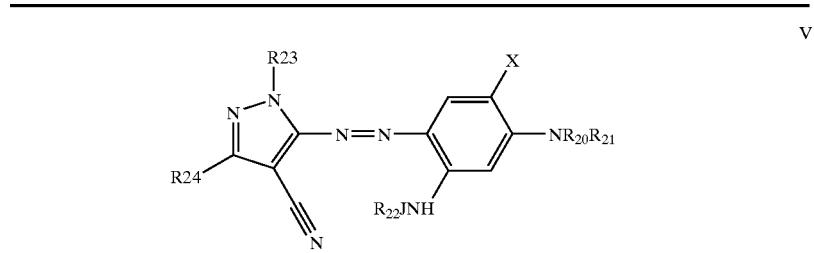

Y-1 and similar colorants can be prepared by the methods outlined in U.S. Pat. No. 5,081,101, the disclosure of which is hereby incorporated by reference.

Additional useful examples of yellow colorants are disclosed in U.S. Pat. No. 5,023,229, columns 5 through 7, the disclosure of which is hereby incorporated by reference.

Useful magenta colorants within the scope of formulas V and VI include the following:

V

| Colorant | $R_{20}$ | $R_{21}$ | $R_{22}$ | $R_{23}$ | $R_{24}$ | X | J |
|---|---|---|---|---|---|---|---|
| Va | $C_2H_5$ | $C_2H_5$ | $CH_3$ | $CH_2CH(OH)CH_3$ | $t-C_4H_9$ | $OCH_3$ | CO |
| Vb | $C_2H_5$ | $C_2H_5$ | $CH_3$ | $CH_3$ | $t-C_4H_9$ | $OCH_3$ | CO |
| Vc | $C_2H_5$ | $C_2H_5$ | $t-C_4H_9$ | $CH_3$ | $CH_3$ | $OCH_3$ | CO |
| Vd | $C_3H_7$ | $C_3H_7$ | $CH_3$ | $CH_3$ | $t-C_4H_9$ | $OCH_3$ | CO |
| Ve | $C_2H_5$ | $C_2H_5$ | $CH_3$ | $CH_2CH_3$ | $t-C_4H_9$ | $OCH_2CH_3$ | $SO_2$ |
| Vf | $C_2H_5$ | $C_2H_5$ | $C_2H_5$ | $CH_3$ | $CH_3$ | $OCH_2CH_3$ | CO |
| Vg | $C_2H_5$ | $C_3H_7$ | $CH_3$ | $CH_3$ | $t-C_4H_9$ | $OCH_3$ | CO |
| Vh | $C_2H_5$ | $C_2H_5$ | $CH_3$ | $CH_3$ | $t-C_4H_9$ | $OCH_3$ | $CO_2$ |
| Vj | $C_2H_5$ | $C_2H_5$ | $C_6H_5$ | $C_3H_7$ | $t-C_4H_9$ | $OCH_2CH_3$ | $SO_2$ |
| Vk | $CH_2CH=CH_2$ | $CH_2CH=CH_2$ | $CH_3$ | $CH_2C_6H_5$ | $t-C_4H_9$ | $OCH_3$ | CO |
| Vm | $C_3H_7$ | $C_3H_7$ | $C_2H_5$ | $C_2H_5$ | $CH_3$ | $OC_3H_7$ | CO |
| Vn | $C_3H_7$ | $C_3H_7$ | $C_2H_5$ | $C_2H_5$ | $CH_3$ | $OC_3H_7$ | $SO_2$ |
| Vo | $C_2H_5$ | $C_2H_5$ | $CH_3$ | $CH_2C(O)OC_2H_5$ | $t-C_4H_9$ | $OCH_3$ | CO |
| Vp | $C_2H_5$ | $C_2H_5$ | $CH_3$ | $CH_2C(O)OC_3H_7$ | $t-C_4H_9$ | $OCH_3$ | CO |

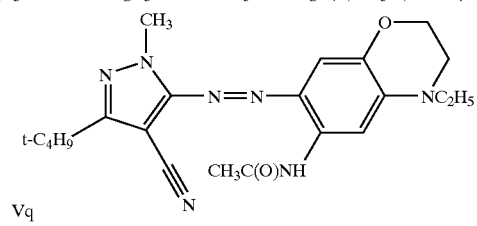

Vq

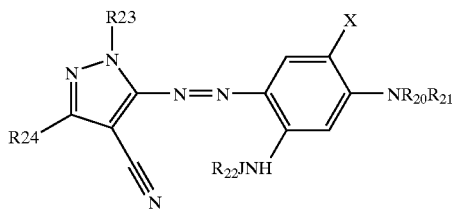

V

| Colorant | $R_{20}$ | $R_{21}$ | $R_{22}$ | $R_{23}$ | $R_{24}$ | X | J |
|----------|----------|----------|----------|----------|----------|---|---|

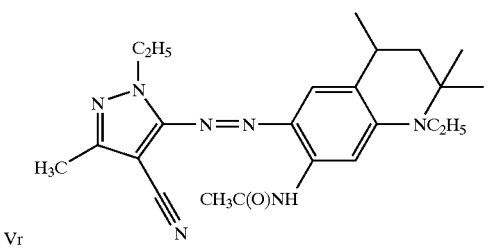

Vr

The above colorants and synthetic procedures for making these are disclosed in U.S. Pat. No. 3,336,285, GB 1,566,985, DE 2,600,036 and Dyes and Pigments, Vol 3, 81 (1982), the disclosures of which are hereby incorporated by reference.

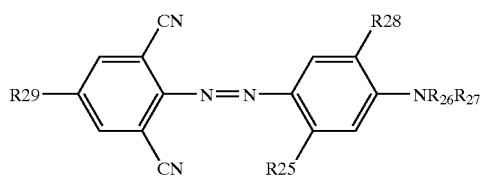

VI

| Colorant | $R_{25}$ | $R_{26}$ | $R_{27}$ | $R_{28}$ | $R_{29}$ |
|----------|----------|----------|----------|----------|----------|
| VIa | $NHCOCH_3$ | $C_2H_5$ | $C_2H_5$ | H | $CH_3$ |
| VIb | $NHSO_2CH_3$ | $C_2H_5$ | $C_3H_7$ | H | $OCH_3$ |
| VIc | $CH_3$ | $C_2H_5$ | $C_3H_7$ | H | $OCH_3$ |
| VId | $NHSO_2CH_3$ | $C_3H_7$ | $C_3H_7$ | H | $CH_3$ |
| VIe | $NHSO_2CH_3$ | $C_2H_5$ | $C_2H_5$ | H | $CH_3$ |
| VIf | $NHCOCH_3$ | $CH_2CH_2OH$ | $C_3H_7$ | H | $OCH_3$ |

The compounds of the above formula VI employed in the invention are disclosed along with their preparation in U.S. Pat. No. 5,234,887, the disclosure of which is hereby incorporated by reference.

Useful cyan colorants within the scope of formula VII include those colorants disclosed in U.S. Pat. No. 5,024,990, columns 4 through 7. The preparation of these materials is also disclosed in U.S. Pat. No. 5,024,990, the disclosure of which is hereby incorporated by reference. In preferred embodiments of the invention, colorants VIIa and VIIb are used:

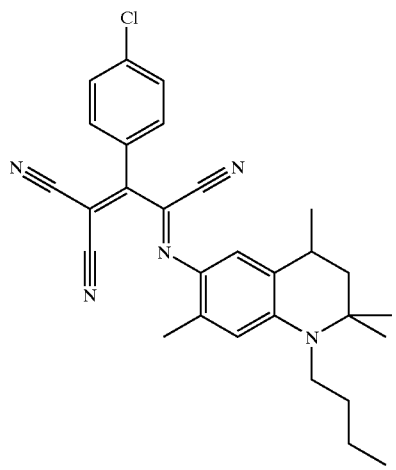

VIIa

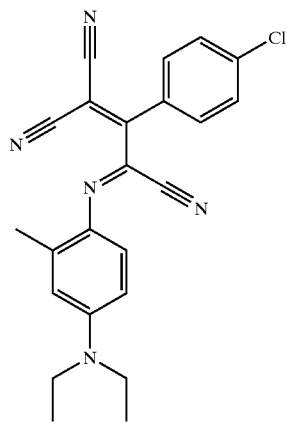

VIIb

Useful cyan colorants within the scope of formula VIII include those colorants disclosed in U.S. Pat. No. 5,866,510, column 9, lines 1 through 24, the disclosure of which is hereby incorporated by reference. In a preferred embodiment of the invention, colorant VIIIa is used:

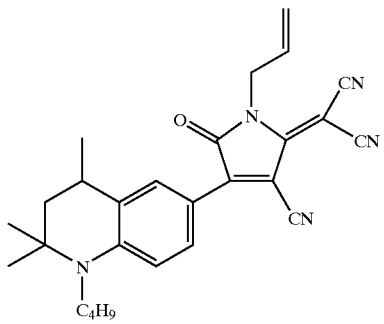

VIIIa

Useful cyan colorants within the scope of formula IX include those colorants disclosed in U.S. Pat. No. 5,024,990, column 7, lines 30 through 68, and column 8, lines 20 through 44, the disclosure of which is hereby incorporated by reference. The compounds of formula IX employed in the invention may be prepared by any of the processes disclosed in U.S. Pat. No. 4,695,287 and U.K. Patent 2,161,824, the disclosure of which are hereby incorporated by reference Unless otherwise specifically stated, use of the term "group", "substituted" or "substituent" means any group or radical other than hydrogen. Additionally, when reference is made in this application to a compound or group that contains a substitutable hydrogen, it is also intended to encompass not only the unsubstituted form, but also its form further substituted with any substituent group or groups as herein mentioned, so long as the substituent does not destroy properties necessary for the intended utility. Suitably, a substituent group may be halogen or may be bonded to the remainder of the molecule by an atom of carbon, silicon, oxygen, nitrogen, phosphorous, or sulfur. The substituent may be, for example, halogen, such as chloro, bromo or fluoro; nitro; hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy) propyl, cyclohexyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy) ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy) butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl)carbonylamino, p-dodecyl-phenylcarbonylamino, p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecylbenzenesulfonamido, N-methyltetradecylsulfonamido, N,N-dipropyl-sulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl; N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen and sulfur, such as 2-furyl, 2-thienyl, 2-benzimidazolyloxy or 2-benzothiazolyl; quaternary ammonium, such as triethylammonium; and silyloxy, such as trimethylsilyloxy.

If desired, the substituents may themselves be further substituted one or more times with the described substituent groups. The particular substituents used may be selected by those skilled in the art to attain the desired desirable properties for a specific application and can include, for example, hydrophobic groups, solubilizing groups, blocking groups, and releasing or releasable groups. When a molecule may have two or more substituents, the substituents may be joined together to form a ring such as a fused ring unless otherwise provided.

The colorants may conveniently be used at a coverage of from about 0.05 to about 1 g/m² and are preferably hydrophobic. The colorant in the colorant-donor element is dispersed in a polymeric binder such as a cellulose derivative, e.g., cellulose acetate hydrogen phthalate, cellulose acetate, cellulose acetate propionate, cellulose acetate butyrate, cellulose triacetate; a polycarbonate; poly(styrene-co-acrylonitrile), a poly(sulfone) or a poly(phenylene oxide). The binder may be used at a coverage of from about 0.1 to about 5 g/m².

The colorant layer of the colorant-donor element may be coated on the support or printed thereon by a printing technique such as a gravure process.

Any material can be used as the support for the colorant-donor element of the invention provided it is dimensionally stable and can withstand the heat generated by the laser beam. Such materials include polyesters such as poly(ethylene terephthalate); polyamides; polycarbonates; glassine paper; condenser paper; cellulose esters such as cellulose acetate; fluorine polymers such as polyvinylidene fluoride or poly(tetrafluoroethylene-co-hexafluoropropylene); polyethers such as polyoxymethylene; polyacetals; polyolefins such as polystyrene, polyethylene, polypropylene or methylpentane polymers. The support generally has a thickness of from about 2 to about 250 μm. It may also be coated with a subbing layer, if desired.

The colorant-receiving element that is used with the colorant-donor element of the invention usually comprises a support having thereon a colorant image-receiving layer. The support may be a transparent film such as a poly(ether sulfone), a polyimide, a cellulose ester such as cellulose acetate, a poly(vinyl alcohol-co-acetal) or a poly(ethylene terephthalate). The support for the colorant-receiving element may also be reflective such as baryta-coated paper, polyethylene-coated paper, white polyester (polyester with white pigment incorporated therein), an ivory paper, a condenser paper or a synthetic paper such as duPont Tyvek®. The colorant image-receiving layer may comprise, for example, a polycarbonate, a polyurethane, a polyester, polyvinyl chloride, poly(styrene-co-acrylonitrile), poly(caprolactone) or mixtures thereof.

The colorant image-receiving layer may be present in any amount which is effective for the intended purpose. In general, good results have been obtained at a concentration of from about 1 to about 5 g/m².

As noted above, the colorant-donor elements of the invention are used to form a colorant transfer image. Such a process comprises imagewise-heating a colorant-donor element as described above using a laser, and transferring a colorant image to a colorant-receiving element to form the colorant transfer image.

The colorant-donor element of the invention may be used in sheet form or in a continuous roll or ribbon. If a continuous roll or ribbon is employed, it may have only one colorant or may have alternating areas of other different colorants, such as sublimable cyan and/or magenta and/or yellow and/or black or other colorants. Such colorants are disclosed in U.S. Pat. Nos. 4,541,830; 4,698,651; 4,695,287; 4,701,439; 4,757,046; 4,743,582; 4,769,360; and 4,753,922, the disclosures of which are hereby incorporated by reference.

Thus, one-, two-, three- or four-color elements (or higher numbers also) are included within the scope of the invention.

In a preferred embodiment of the invention, the colorant-donor element comprises a poly(ethylene terephthalate) support coated with sequential repeating areas of cyan, magenta and yellow colorant, and the above process steps are sequentially performed for each color to obtain a three-color colorant transfer image. Of course, when the process is only performed for a single color, then a monochrome colorant transfer image is obtained.

Several different kinds of lasers could conceivably be used to effect the thermal transfer of colorant from a donor sheet to a receiver, such as ion gas lasers like argon and krypton; metal vapor lasers such as copper, gold, and cadmium; solid state lasers such as ruby or YAG; or diode lasers such as gallium arsenide emitting in the infrared region from 750 to 870 nm. However, in practice, the diode lasers offer substantial advantages in terms of their small size, low cost, stability, reliability, ruggedness, and ease of modulation. In practice, before any laser can be used to heat a colorant-donor element, the laser radiation must be absorbed into the colorant layer and converted to heat by a molecular process known as internal conversion. Thus, the construction of a useful colorant layer will depend not only on the hue, sublimability and intensity of the image colorant, but also on the ability of the colorant layer to absorb the radiation and convert it to heat.

Lasers which can be used to transfer colorant from the colorant-donor elements of the invention are available commercially. There can be employed, for example, Laser Model SDL-2420-H2® from Spectrodiode Labs, or Laser Model SLD 304 V/W® from Sony Corp.

A thermal colorant transfer assemblage of the invention comprises (a) a colorant-donor element as described above, and (b) a colorant-receiving element as described above, the colorant-receiving element being in a superposed relationship with the colorant-donor element so that the colorant layer of the donor element is adjacent to and overlying the image-receiving layer of the receiving element.

The above assemblage comprising these two elements may be preassembled as an integral unit when a monochrome image is to be obtained. This may be done by temporarily adhering the two elements together at their margins. After transfer, the colorant-receiving element is then peeled apart to reveal the colorant transfer image.

When a three-color image is to be obtained, the above assemblage is formed on three occasions during the time when heat is applied using the laser beam. After the first colorant is transferred, the elements are peeled apart. A second colorant-donor element (or another area of the donor element with a different colorant area) is then brought in register with the colorant-receiving element and the process repeated. The third color is obtained in the same manner.

Synthesis

General preparation of the colorants with t=1 useful in this invention is illustrated by the following synthetic scheme (Colorant 1).

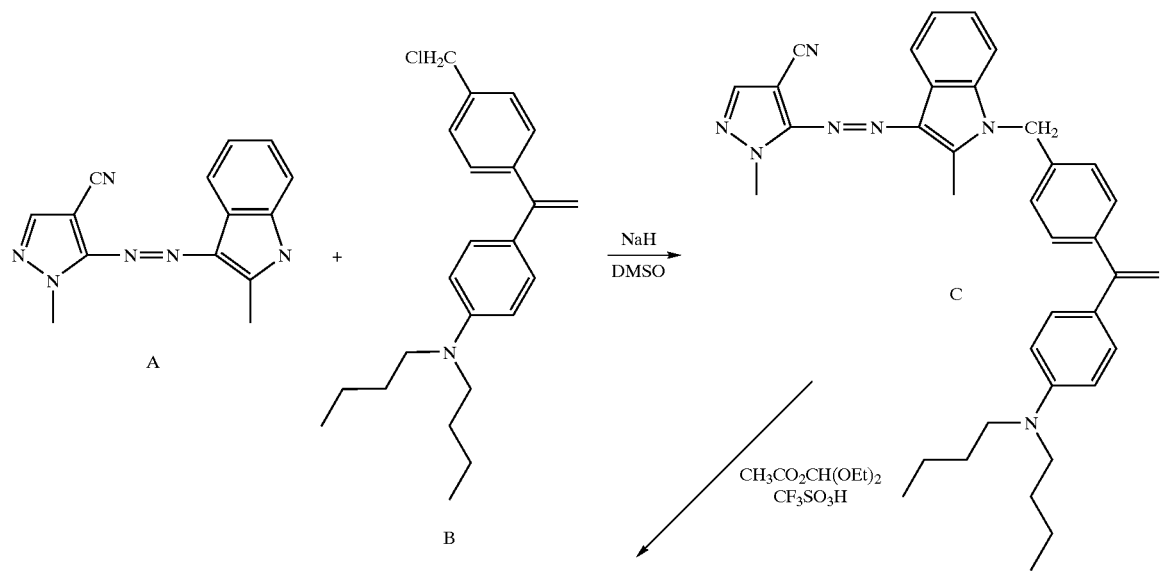

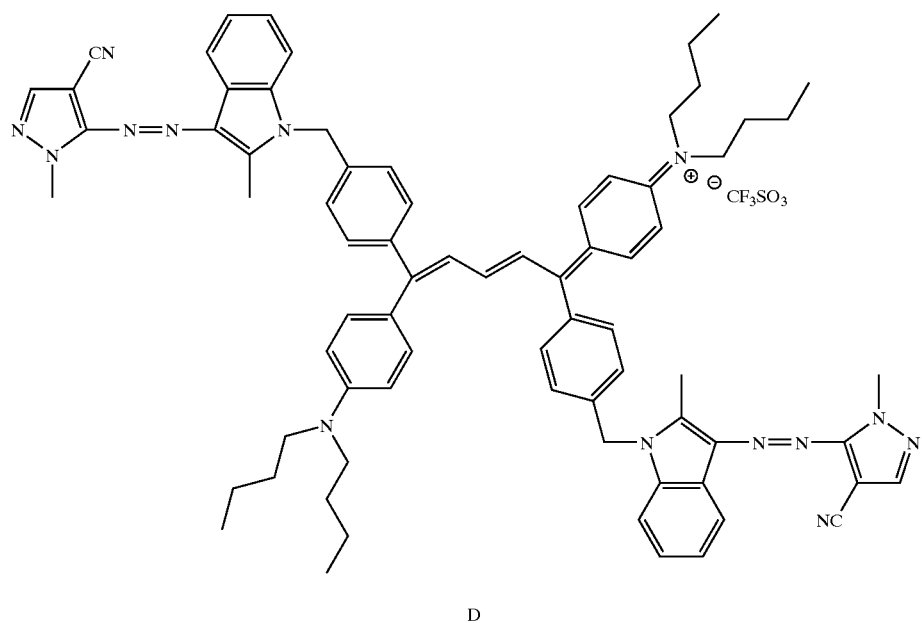

D

To a 200 ml round bottomed flask containing a sample of yellow colorant intermediate A (3.8 g, 14 mmoles) and DMSO (50 ml) was added sodium hydride (0.7 g, 60% in mineral oil, 17 mmoles). The resulting mixture was stirred under $N_2$ at room temperature for 0.5 hr before the intermediate B (4.3 g, 12 mmoles) was added. After overnight stirring at room temperature, the mixture was diluted with water (500 ml), a yellow solid began to precipitate from the solution, the solid was collected by filtration and washed with more water. The unreacted starting materials A and B could be removed from methanol and heptane washes respectively. 3.8 g of pure intermediate C was obtained at 54% yield.

A sample of intermediate C (3.7 g, 6.4 mmoles) was dissolved in acetic acid (25 ml), then diethoxymethyl acetate (1.62 g, 10 mmoles) was added and finally triflic acid (0.5 g, 3.3 mmoles) were added dropwise. The resulting mixture was heated to reflux for half-hour (the reaction was monitored by appearance of an ir peak at 850 nm).

The mixture was cooled with an ice-water bath and poured to a beaker containing 500 ml ether, the product started to precipitate, the solid was collected and recrystallized twice from ethanol (100 ml), 3.0 g material was obtained at 80% yield.

General preparation of the colorants with t=0 useful in this invention is illustrated by the following synthetic scheme (Colorant 5).

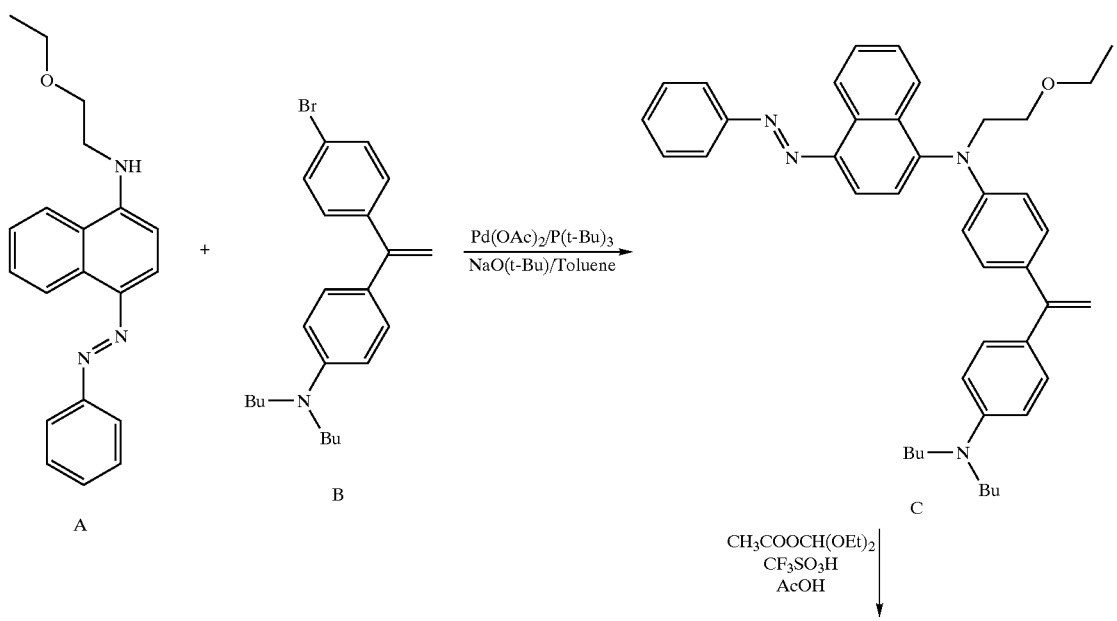

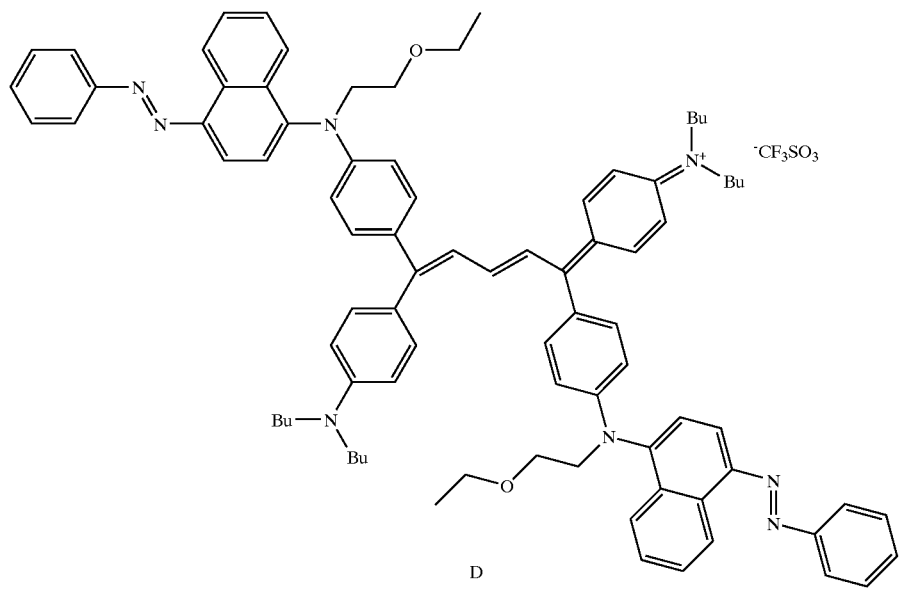

To a mixture of intermediate A (3.0 g, 9.4 mmoles) and B (3.6 g, 9.4 mmoles) in toluene (20 ml) were added under $N_2$ palladium acetate (30 mg, 0.12 mmoles), tri-t-butylphosphine (36 mg, 0.18 mmoles) and sodium-t-butyl oxide (1.4 g, 14.5 mmoles) The resulting mixture was heated at reflux for 2 hours. Water (50 ml) was added to quench the reaction, the mixture was extracted with ethyl acetate (2×50 ml), the organic layer was dried over sodium sulfate, the residual after solvent removal was purified through a silica gel column eluted with 1:1 heptane/ethyl acetate. 4.8 g of product was obtained at 82% yield.

A sample of intermediate C (3.26 g, 5 mmoles) was dissolved in acetic acid (25 ml), then diethoxymethyl acetate (1.26 g, 8 mmoles) was added and finally triflic acid (0.4 g, 3 mmoles) were added dropwise. The resulting mixture was heated to reflux for half-hour (the reaction was monitored by appearance of an ir peak at 830 nm). The mixture was cooled with an ice-water bath and poured to a beak containing 400 ml ether, the product started to precipitate, the solid was collected and recrystalized twice from ethanol (80 ml), 2.0 g product was obtained.

The following examples are provided to illustrate the invention.

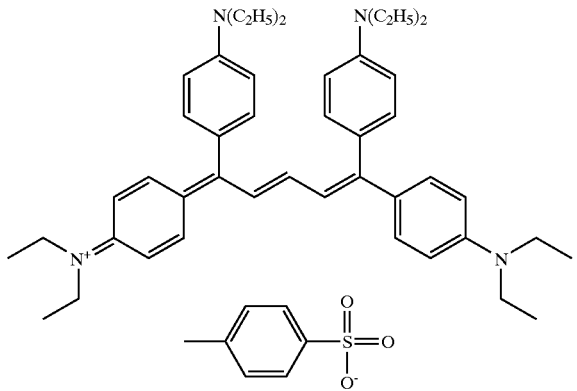

Colorant C-1 ($\lambda_{max1}$ = 653 nm; $\lambda_{max2}$ = 840 nm)
Comparison

INVENTIVE EXAMPLE 1

A magenta donor element according to the invention was prepared by coating an unsubbed 100 μm thick poly(ethyleneterephthalate) support with a layer containing colorant Va (0.39 g/m$^2$), colorant IIIf (0.06 g/m$^2$) and the color-matched infrared absorbing Colorant 2 (0.07 g/m$^2$) in a cellulose acetate propionate binder (0.43 g/m$^2$) coated from a mixture of methyl-i-butyl ketone/ethanol to provide a layer of 0.95 g/m$^2$ total solid laydown.

COMPARATIVE EXAMPLE 2

A magenta donor element was prepared by coating an unsubbed 100 μm thick poly(ethyleneterephthalate) support with a layer containing colorant Va (0.36 g/m$^2$), colorant IIIf (0.05 g/m$^2$), and the color-mismatched infrared absorbing comparative Colorant C-1 (0.05 g/m$^2$) in a polyvinylbutyral binder (0.43 g/m$^2$) coated from a mixture of toluene/ethanol to provide a layer of 0.88 g/m$^2$ total solid laydown.

An intermediate colorant-receiving element, Kodak Approval® Intermediate Color Proofing Film, CAT# 1067560, was used with the above donor elements to print an image on an Approval® XP digital halftone proofer. For the monochrome images, the power to the laser array was modulated to produce a continuous tone image of uniform exposure steps of varying density as described in U.S. Pat. No. 4,876,235. After the exposure, the intermediate receiver was laminated to Tokuryo Art paper which had been previously laminated with Kodak Approval® Prelaminate, CAT# 1739671. All measurements of the transferred colorant images were made using an X-Rite 938 portable spectrophotometer set for D$_{50}$ illuminant and 2° observer angle. Readings were made with black backing behind the samples. The saturation of the image can be evaluated using C*, where C* is defined as $C^* = \sqrt{(a^*)^2 + (b^*)^2}$. The color differences between the samples can be expressed as ΔE, where ΔE is the vector difference in CIELAB color space between the laser thermal generated image and the defined color aim.

$$\Delta E = \sqrt{((L^*_e - L^*_s)^2 + (a^*_e - a^*_s)^2 + (b^*_e - b^*_s)^2)}$$

wherein subscript e represents the measurements from the experimental materials and subscript s represents the measurements from the color aim. The CIELAB L*, a*, and b* values were determined by interpolation of the raw data to an image density of 1.60 in the color record of interest (red for cyan, and green for magenta).

| Donor element | | L* | a* | b* | C* | Delta E |
|---|---|---|---|---|---|---|
| | Color Aim | 46.60 | 75.10 | −4.40 | 75.23 | — |
| 1 | Invention | 46.4 | 76.16 | −4.9 | 76.3 | 1.2 |
| 2 | Comparative | 42.5 | 67.1 | −12.61 | 68.3 | 12.18 |

As can be seen, the donor element of the invention provided a much closer match to the desired color aim and gave a more saturated image (larger C*) than the comparison.

INVENTIVE EXAMPLE 3

A cyan donor element according to the invention was prepared by coating an unsubbed 100 μm thick poly(ethyleneterephthalate) support with a layer containing colorant VIIIa (0.15 g/m$^2$), colorant VIIa (0.24 g/m$^2$), and the color-matched infrared absorbing Colorant 4 (0.07 g/m$^2$) in a cellulose acetate propionate binder (0.43 g/m$^2$) coated from a mixture of methyl-i-butyl ketone/ethanol.

COMPARATIVE EXAMPLE 4

A cyan donor element was prepared by coating an unsubbed 100 μm thick poly(ethyleneterephthalate) support with a layer containing colorant VIIIa (0.15 g/m$^2$), colorant VIIa (0.24 g/m$^2$), and the color-mismatched infrared absorbing Colorant 1 (0.07 g/m$^2$) in a cellulose acetate propionate binder (0.43 g/m$^2$) coated from a mixture of methyl-i-butyl ketone/ethanol.

These donor elements were used as in examples 1 and 2 above to generate monochrome images on Tokuryo Art paper, and the colorimetry was measured as described above.

| Donor element | | L* | a* | b* | C* | Delta E |
|---|---|---|---|---|---|---|
| | Color aim | 53.90 | −37.00 | −50.10 | 62.28 | — |
| 3 | Invention | 53.4 | −37.55 | −49.7 | 62.3 | 0.8 |
| 4 | comparative | 53.7 | −40.14 | −45.91 | 61.0 | 5.2 |

As can be seen from the data in the table above, the donor element of the invention provided a much closer match to the desired color aim and gave a more saturated image than the comparison.

INVENTIVE EXAMPLE 5

A magenta donor element according to the invention was prepared by coating an unsubbed 100 μm thick poly(ethyleneterephthalate) support with a layer containing colorant Va (0.39 g/m$^2$), colorant IIIf (0.06 g/m$^2$) and the color-matched infrared absorbing Colorant 1 (0.07 g/m$^2$) in a cellulose acetate propionate binder (0.43 g/m$^2$) coated from a mixture of methyl-i-butyl ketone/ethanol.

This donor element was used as in examples 1 and 2 above to generate monochrome images on Tokuryo Art paper, and the colorimetry was measured as described above.

| Donor element | | L* | a* | b* | C* | Delta E |
|---|---|---|---|---|---|---|
| | Color aim | 46.60 | 75.10 | −4.40 | 75.23 | — |
| 5 | Invention | 46.4 | 75.84 | −4.99 | 76.0 | 0.97 |
| 2 | comparative | 42.5 | 67.1 | −12.61 | 68.3 | 12.18 |

As can be seen, the donor element of the invention provided a much closer match to the desired color aim and gave a more saturated image than the comparison.

This same principle of having an imaging element with a color matched infrared-visible bichromophore can be applied to laser thermal donor elements that meet the color requirements for other color standards. In the U.S., the CIELAB L* a* b* coordinates are reported to a Status T density of 0.98 for comparison with a SWOP certified press sheet (00-15-162), as well as the publication ANSI-CGATS TR 001-1995, the disclosure of which is hereby incorporated by reference. The following example illustrates the utility of the invention for this purpose.

INVENTIVE EXAMPLE 6

A donor element according to the invention was prepared by coating an unsubbed 100 μm thick poly(ethyleneterephthalate) support with a layer containing colorant IIh (0.12 g/m$^2$), colorant IIIb (0.06 g/m$^2$), colorant IIIp (0.10 g/m$^2$), colorant Y-1 (0.03 g/m$^2$) and the color-matched infrared absorbing Colorant 1 (0.07 g/m$^2$) in a polyvinylbutyral binder (0.40 g/m$^2$) coated from a mixture of toluene/ethanol.

COMPARATIVE EXAMPLE 7

A donor element was prepared by coating an unsubbed 100 μm thick poly(ethyleneterephthalate) support with a layer containing colorant IIh (0.12 g/m$^2$), colorant IIIb (0.06 g/m$^2$), colorant IIIp (0.10 g/m$^2$), colorant Y-1 (0.03 g/m$^2$) and the infrared absorbing Colorant C-1 (0.05 g/m$^2$) in a polyvinylbutyral binder (0.40 g/m$^2$) coated from a mixture of toluene/ethanol.

An intermediate colorant-receiving element, Kodak Approval® Intermediate Color Proofing Film, CAT# 1067560, was used with the above donor elements to print an image on an Approval® XP digital halftone proofer. For the monochrome images, the power to the laser array was modulated to produce a continuous tone image of uniform exposure steps of varying density as described in U.S. Pat. No. 4,876,235. After the exposure, the intermediate receiver was laminated to 60# TextWeb™ (Deferient Paper Company) paper which had been previously laminated with Kodak Approval® Prelaminate, P02, CAT# 1739671. All measurements of the transferred colorant images were made using a Gretag SPM100 portable spectrophotometer set for D$_{50}$ illuminant and 2° observer angle. Readings were made with black backing behind the samples.

| Donor element | | L* | a* | b* | C* | Delta E |
|---|---|---|---|---|---|---|
| | Color aim (SWOP certified press sheet 00-15-162) | 84.06 | −5.29 | 82.73 | 82.9 | |
| 6 | Invention | 85.01 | −5.51 | 83.11 | 83.3 | 1.05 |

| Donor element | | L* | a* | b* | C* | Delta E |
|---|---|---|---|---|---|---|
| 7 | comparative | 83.76 | −8.77 | 80.91 | 81.4 | 3.94 |
| | Color aim (CGATS TR-001-1995) | 84.26 | −5.79 | 84.33 | 84.5 | |
| 6 | Invention | 85.01 | −5.51 | 83.11 | 83.3 | 1.46 |
| 7 | comparative | 83.76 | −8.77 | 80.91 | 81.4 | 4.56 |

As can be seen, the donor element of the invention provided a much closer match to the desired color aim and gave a more saturated image than the comparison.

The entire contents of the patents and other publications referred to in this specification are incorporated herein by reference.

What is claimed is:

1. An imaging element comprising a bichromophoric molecule comprising an infrared-absorbing first chromophore that exhibits a first absorption maximum above 700 nm and a second chromophore that exhibits a second absorption maximum below 700 nm, wherein the absorption of the first and second chromophores are substantially independent of each other.

2. The element of claim 1 wherein the element is a thermal transfer element.

3. The element of claim 2 wherein the element is a laser thermal imaging element where the laser exhibits a wavelength above 700 nm.

4. The element of claim 1 wherein the second absorption maximum is from 400 to 700 nm.

5. The element of claim 1 wherein the bichromophoric molecule of claim 1 represented by a general formula:

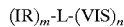

$$(IR)_m\text{-}L\text{-}(VIS)_n$$

wherein:

L represents the non-chromophoric portions of the molecule and does not conjugate the first and second chromophores;

each IR chromophore independently represents a chromophore with λ-max above 700 nm;

each VIS chromophore independently represents a visible chromophore with λ-max from 400–700; and m and n are independently 1–6.

6. The element of claim 5 wherein the visible chromophore exhibits a λ-max in the range of 400–500 nm.

7. The element of claim 5 wherein the visible chromophore exhibits a λ-max in the range of 500–600 nm.

8. The element of claim 5 wherein the visible chromophore is selected from yellow, cyan, and magenta.

9. The element of claim 5 wherein at least one VIS group contains a pyrazoloazo group, a phenylazo group, a pyrazolodione group, an azoledione group, a pyrazolone group, a phenylamino group, a pyridinone group, an anilino group, a propene group, a cyclohexamine group, or a thiazoleazo group.

10. The element of claim 1 wherein the bichromophoric molecule chromophore having an absorption maximum above 700 nm is a tetra-aryl methine group.

11. The element of claim 5 wherein the visible chromophore exhibits a λ-max in the range of 600–700 nm.

12. The element of claim 1 wherein the bichromophoric molecule is represented by formula I

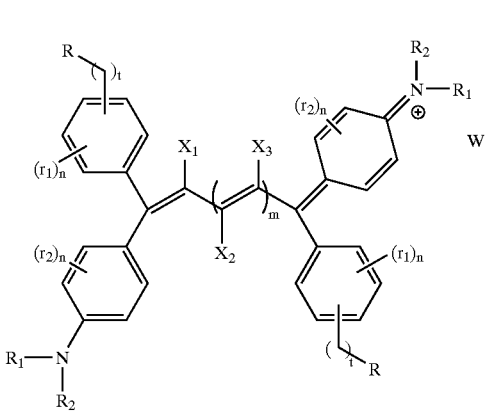

wherein:

- each R independently represents hydrogen or a substituent such that at least one such group is a colored chromophore;
- $X_1$, $X_2$ and $X_3$ each independently represents hydrogen, halogen, cyano, an alkyl group having 1 to 12 carbon atoms, a cycloalkyl group having 5 to 10 carbon atoms in the carbocyclic ring, an aryl group having 6 to 10 carbon atoms in the carbocyclic ring, or any two of said $X_1$, $X_2$, and $X_3$ may be joined together to complete a 5- to 7-membered carbocyclic or heterocyclic ring group, and m is 1–3;
- each of $R_1$ and $R_2$ independently represents an alkyl group having 1 to 12 carbon atoms, a cycloalkyl group having 5 to 10 carbon atoms in the carbocyclic ring, an aryl group having 6 to 10 carbon atoms in the carbocyclic ring, or a heterocyclic or polymeric backbone group, provided $R_1$ and $R_2$ may be joined together to form a 5- to 7-membered heterocyclic ring group and;
- each of $r_1$ and $r_2$ independently represents a substituent groups, and each n is independently 0–4, and each t is independently 0–4; and
- W is a monovalent counter anion to balance the charge on the molecule.

13. The element of claim 12 wherein the molecule is represented by formula II:

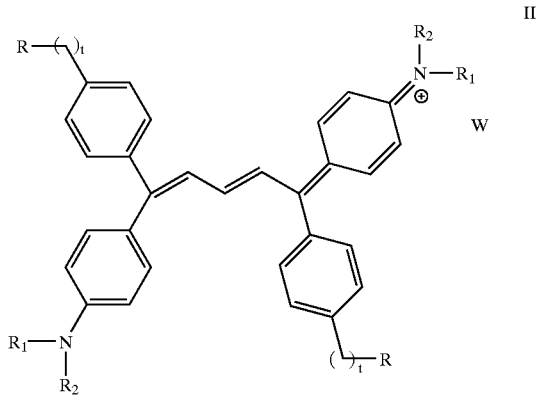

wherein each of R, $R_1$, $R_2$, W, and t are as defined in claim 12.

14. The element of claim 1 wherein the first and second chromophores are not linked by a conjugated chain.

15. The element of claim 1 wherein the bichromophoric molecule is selected from the group consisting of:

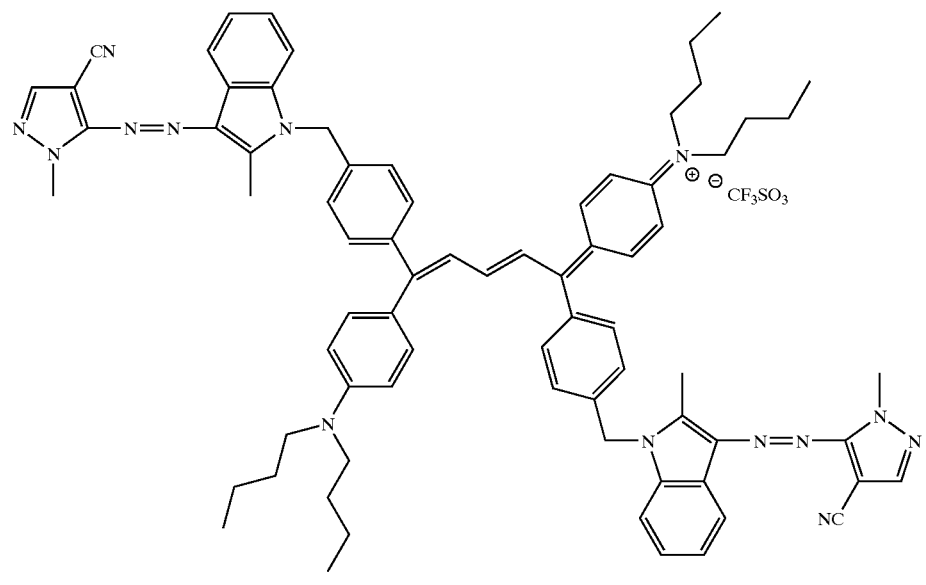

Colorant 1 ($\lambda_{max1}$ = 420 nm; $\lambda_{max2}$ = 864 nm)

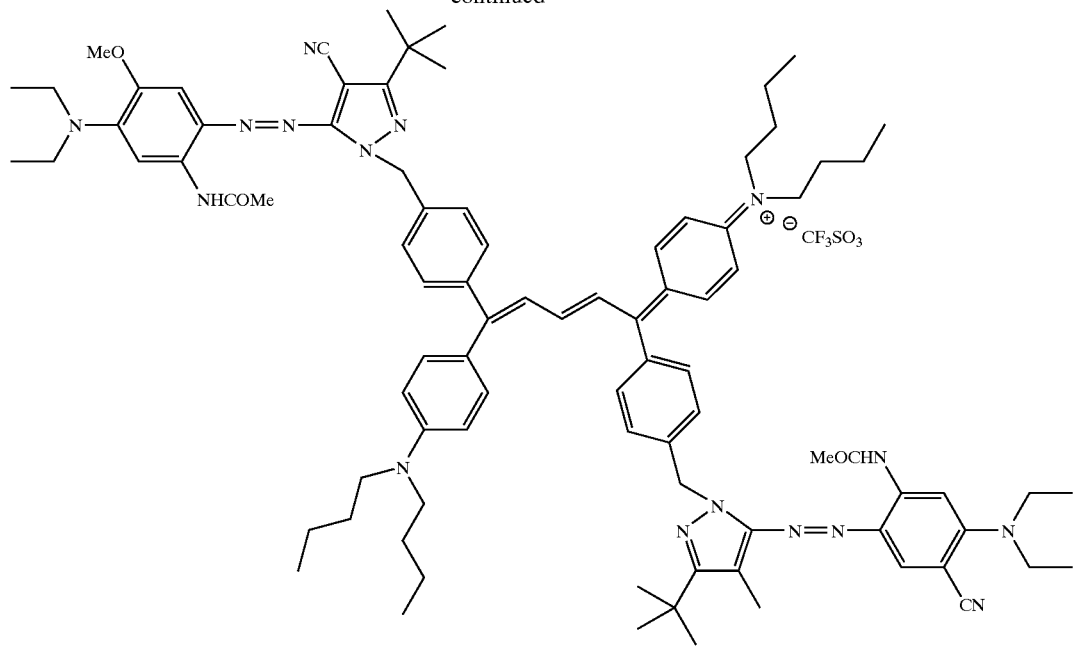
Colorant 2 (λ_max1 = 540 nm; λ_max2 = 575 nm; λ_max3 = 858 nm)
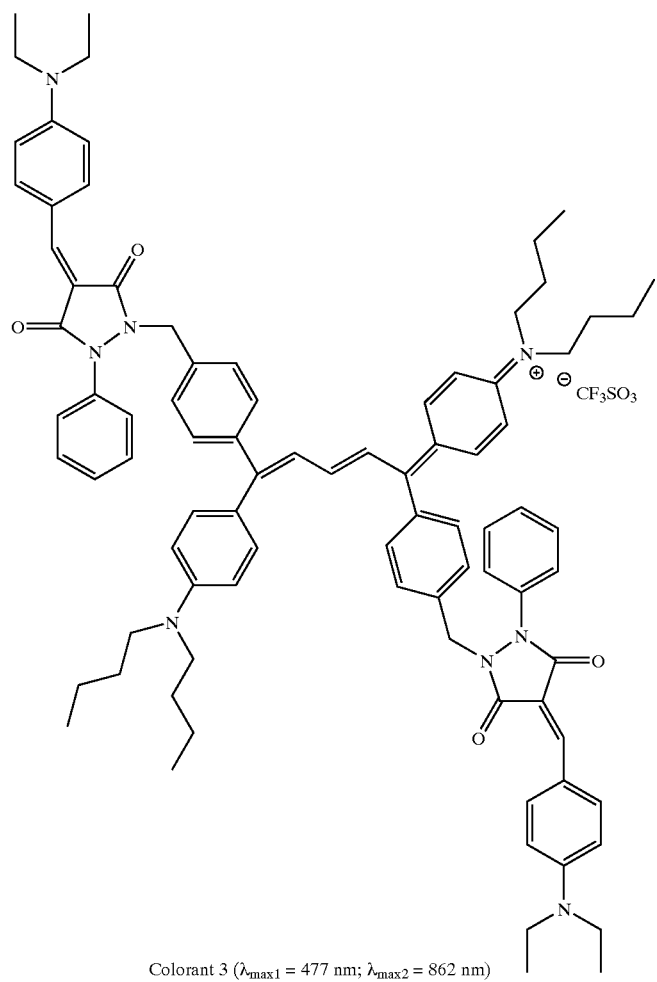
Colorant 3 (λ_max1 = 477 nm; λ_max2 = 862 nm)

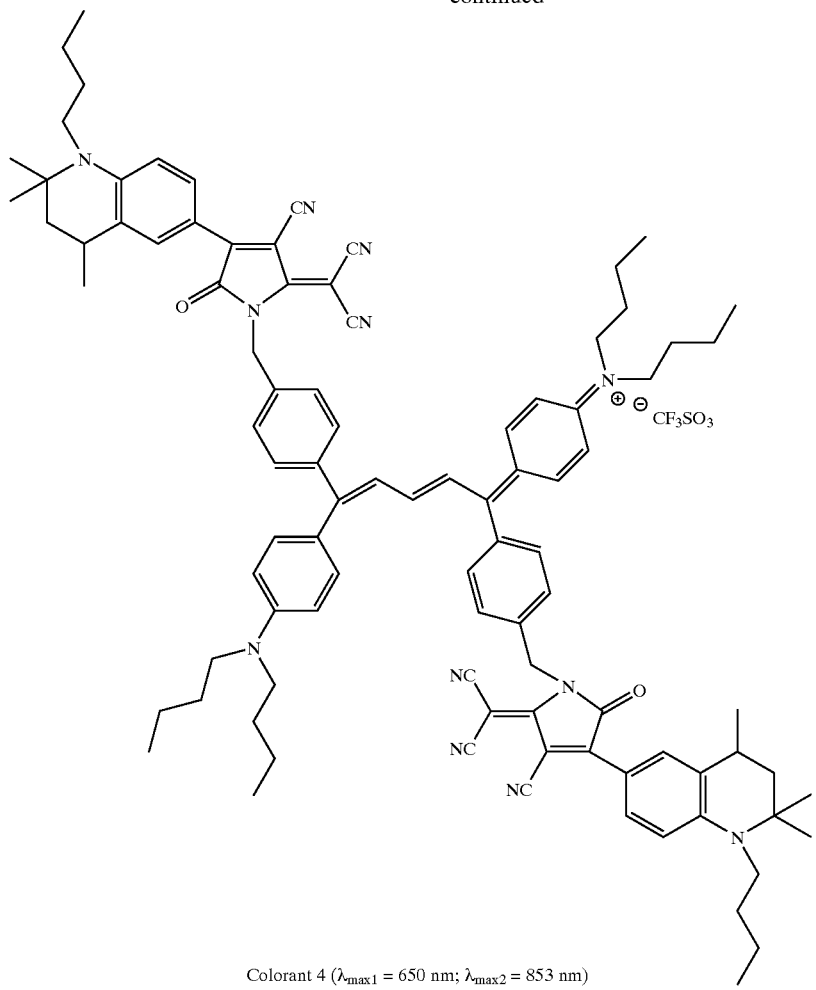
Colorant 4 (λ$_{max1}$ = 650 nm; λ$_{max2}$ = 853 nm)
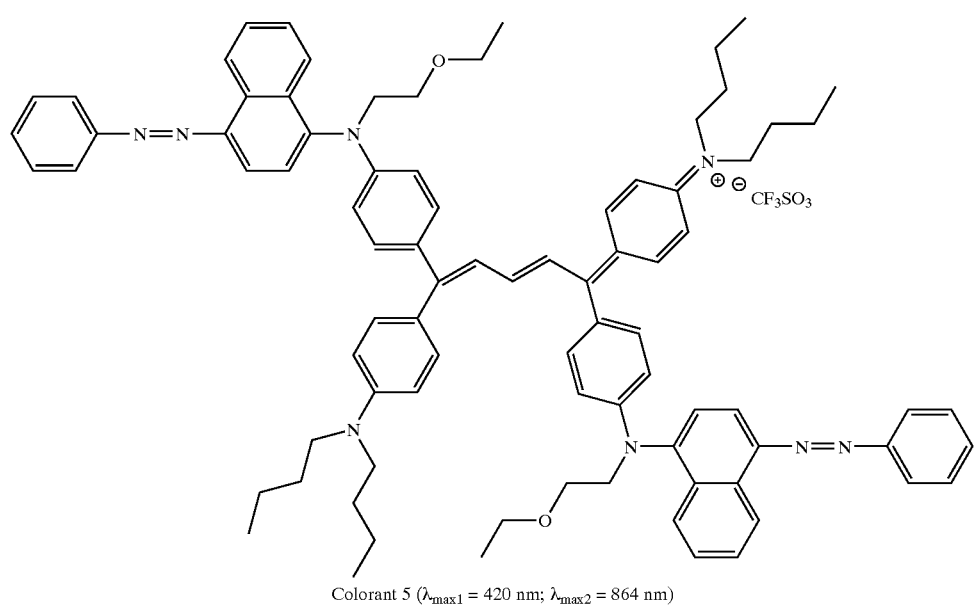
Colorant 5 (λ$_{max1}$ = 420 nm; λ$_{max2}$ = 864 nm)

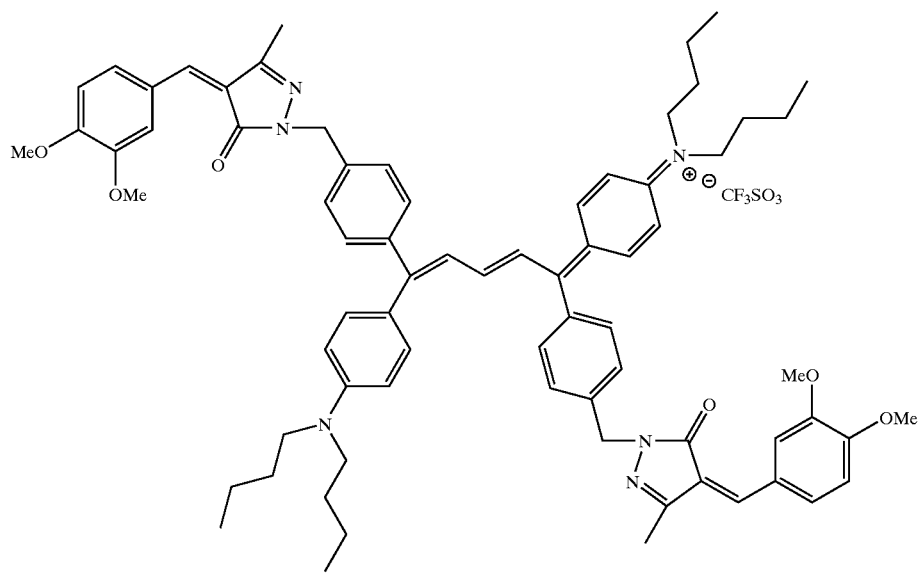
Colorant 6 (λ_max1 = 380 nm; λ_max2 = 861 nm)
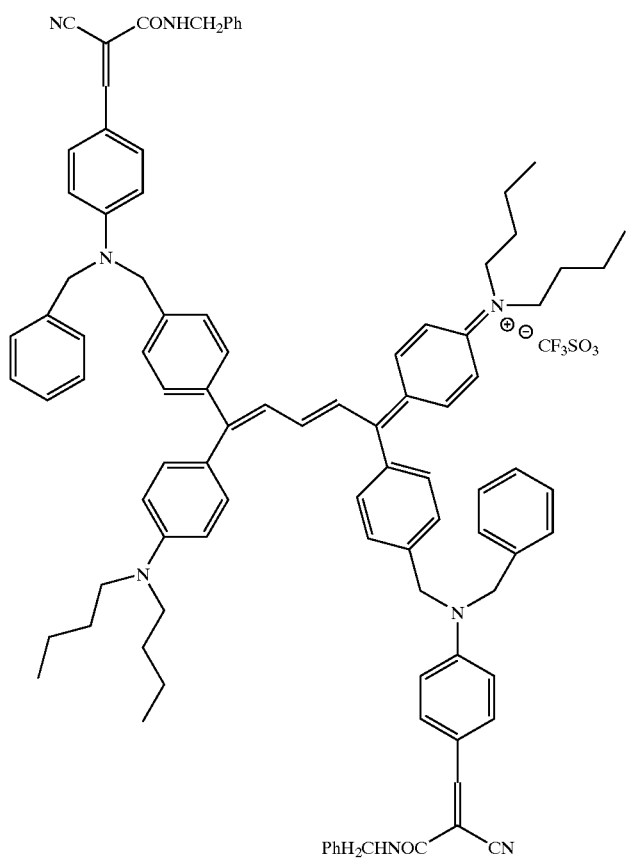
Colorant 7 (λ_max1 = 400 nm; λ_max2 = 864 nm)

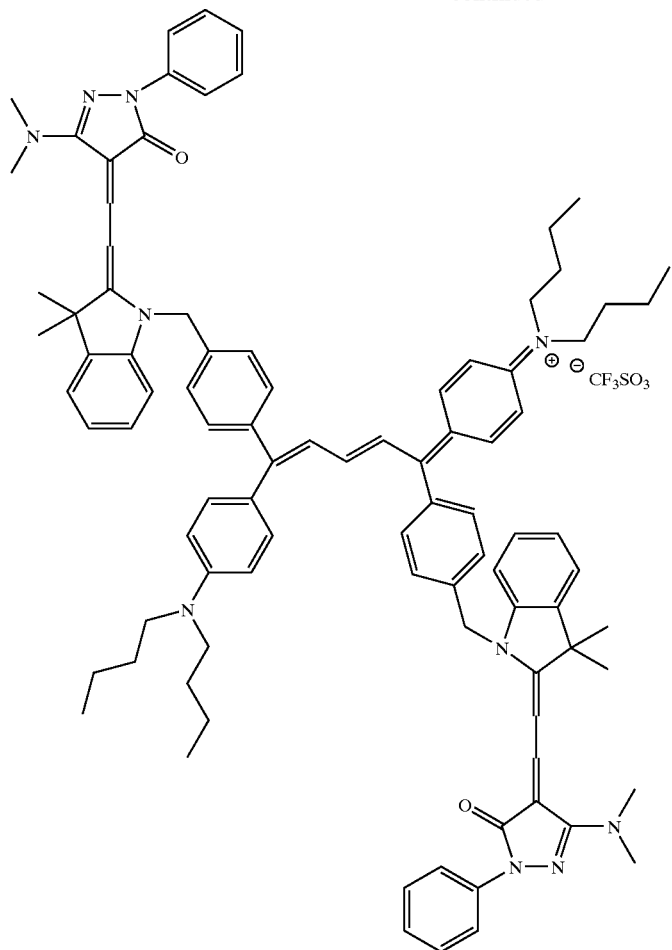
Colorant 8 (λ<sub>max1</sub> = 460 nm; λ<sub>max2</sub> = 863 nm)
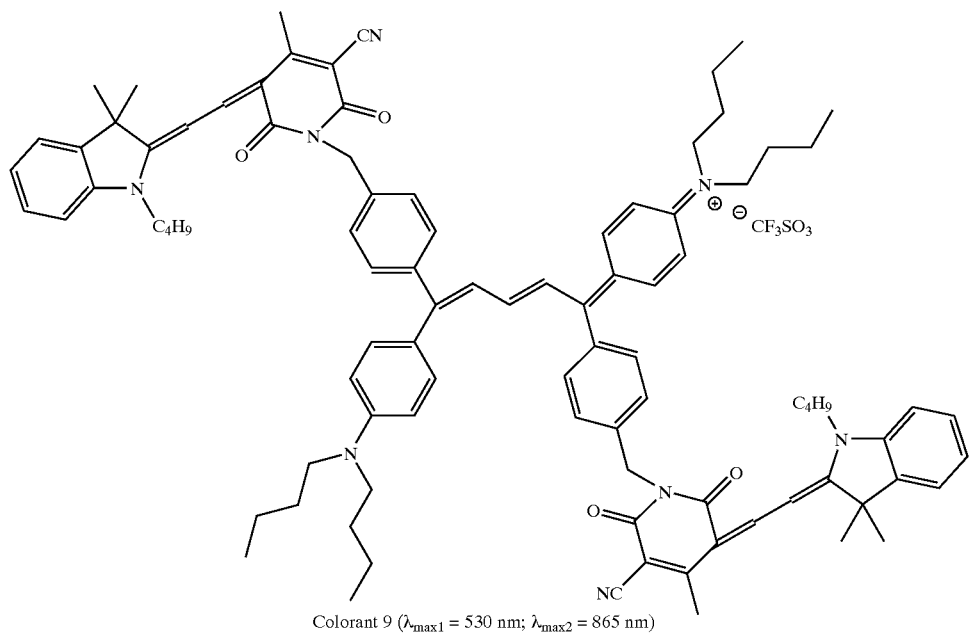
Colorant 9 (λ<sub>max1</sub> = 530 nm; λ<sub>max2</sub> = 865 nm)

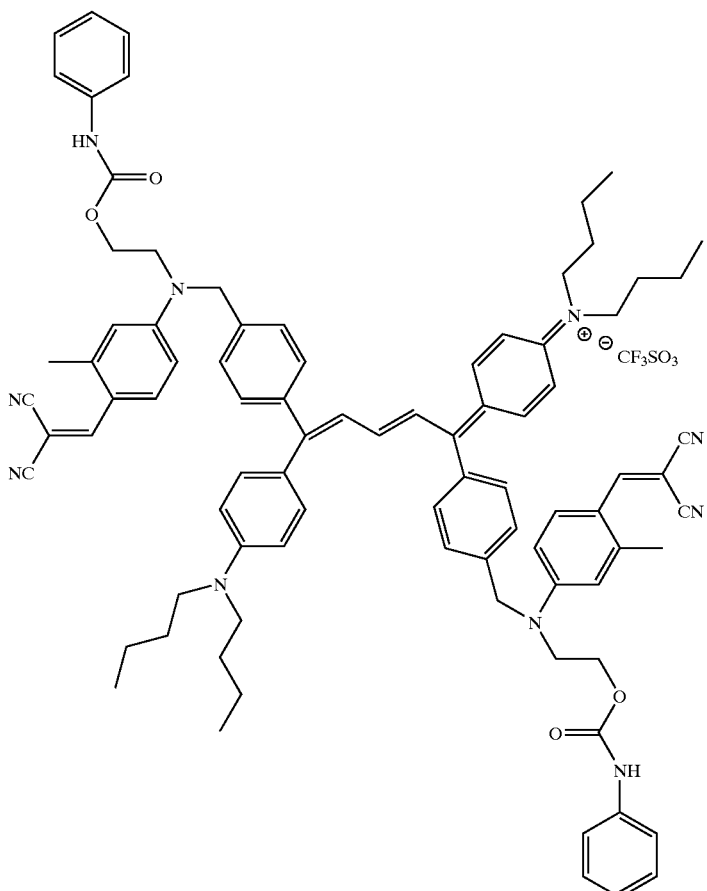
Colorant 10 (λ$_{max1}$ = 440 nm; λ$_{max2}$ = 863 nm)
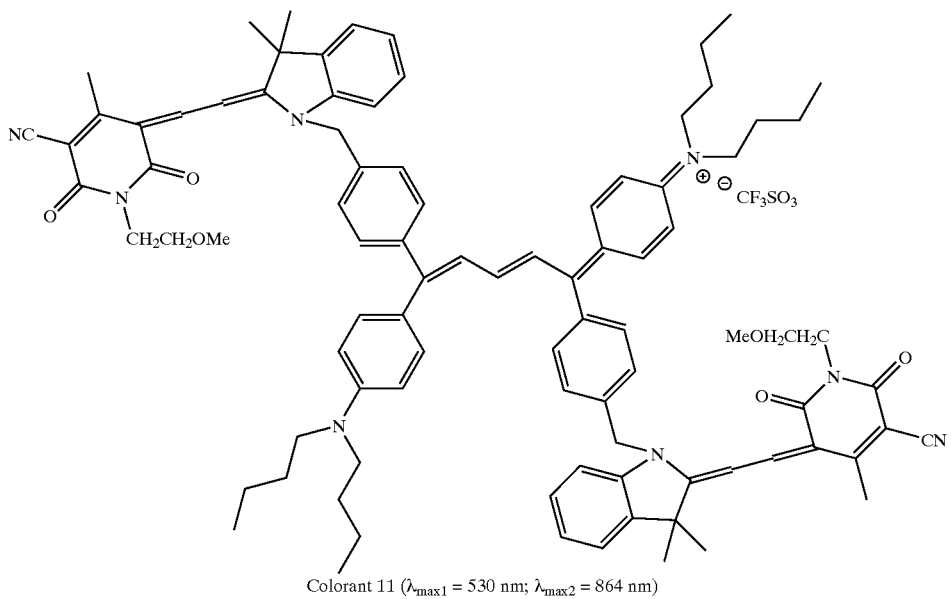
Colorant 11 (λ$_{max1}$ = 530 nm; λ$_{max2}$ = 864 nm)

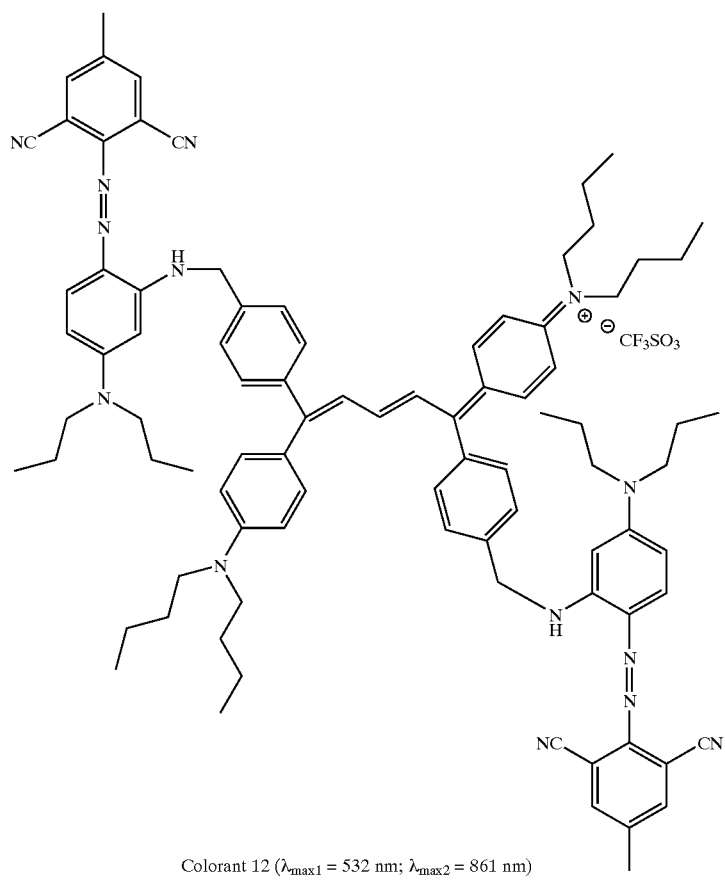
Colorant 12 (λ$_{max1}$ = 532 nm; λ$_{max2}$ = 861 nm)
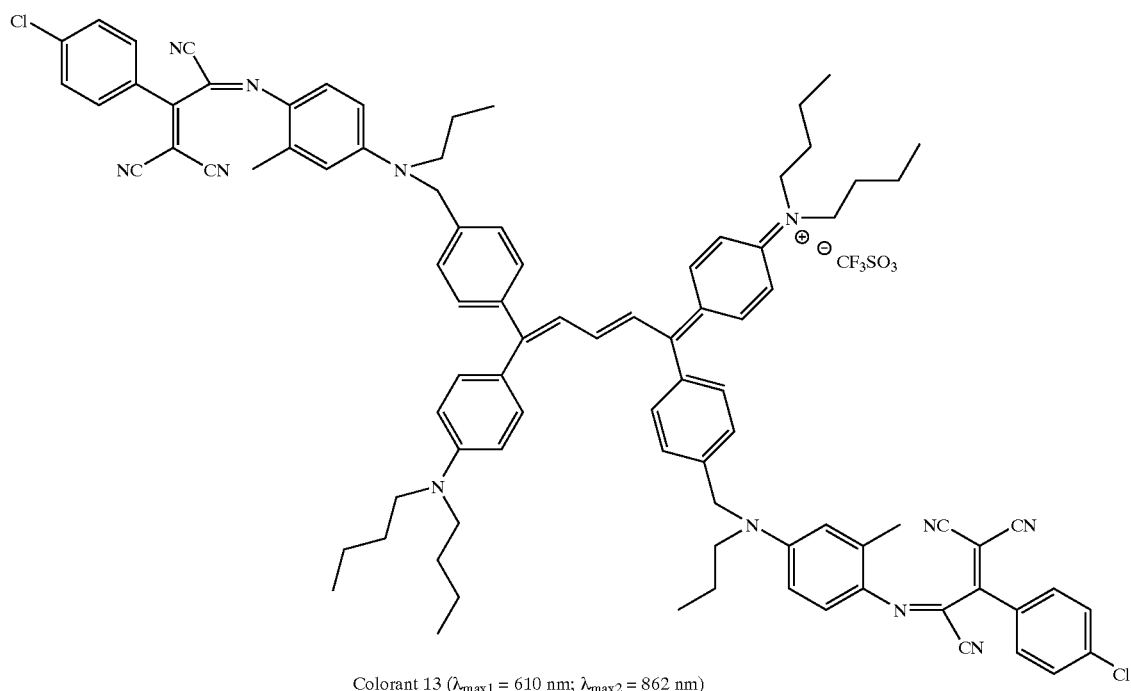
Colorant 13 (λ$_{max1}$ = 610 nm; λ$_{max2}$ = 862 nm)

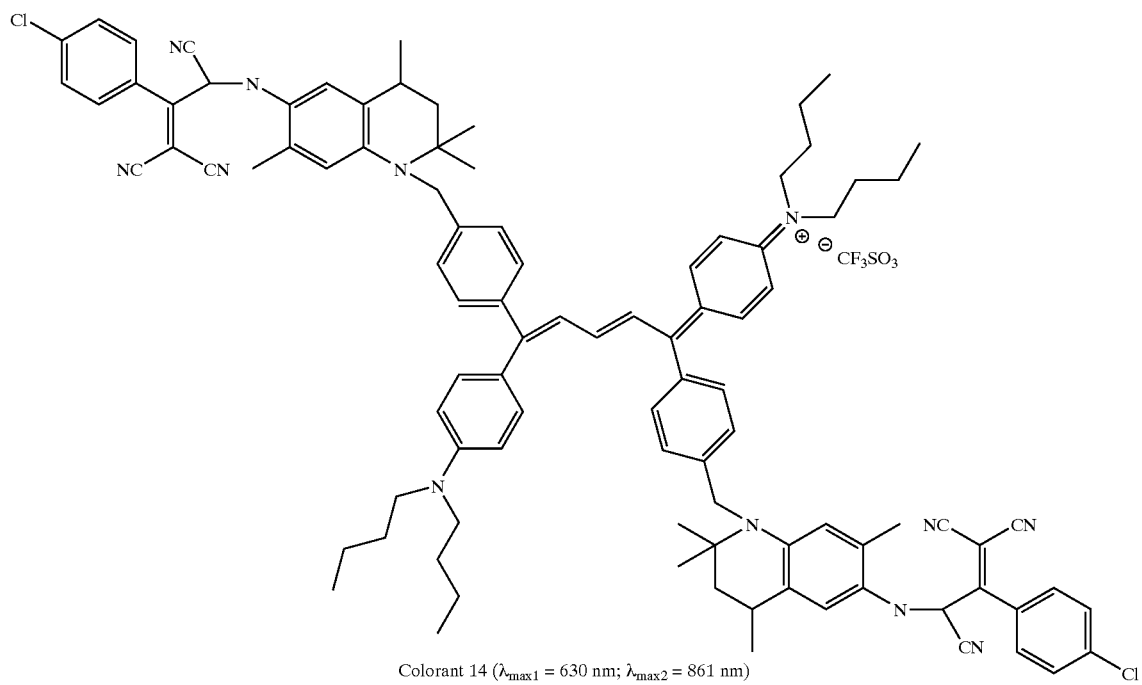
Colorant 14 ($\lambda_{max1}$ = 630 nm; $\lambda_{max2}$ = 861 nm)
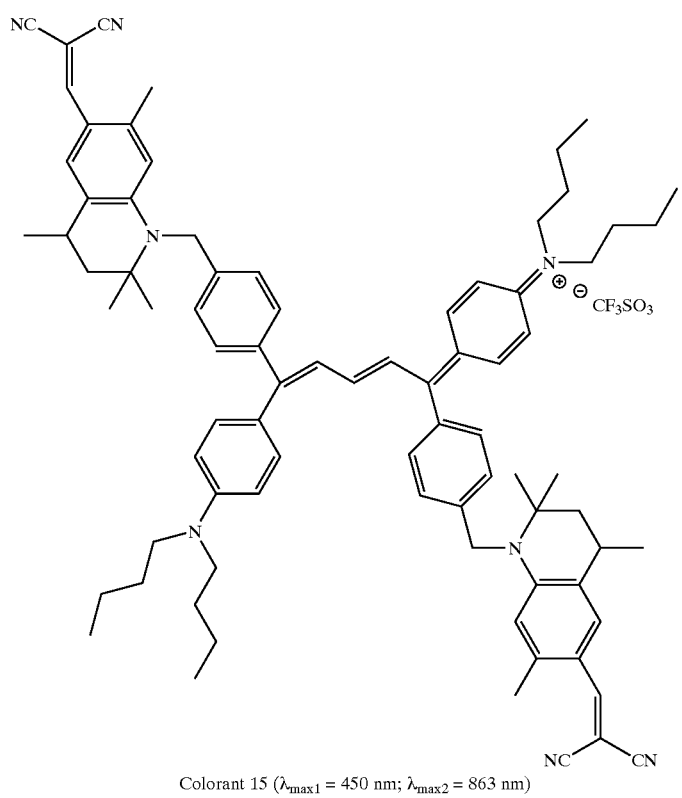
Colorant 15 ($\lambda_{max1}$ = 450 nm; $\lambda_{max2}$ = 863 nm)

-continued
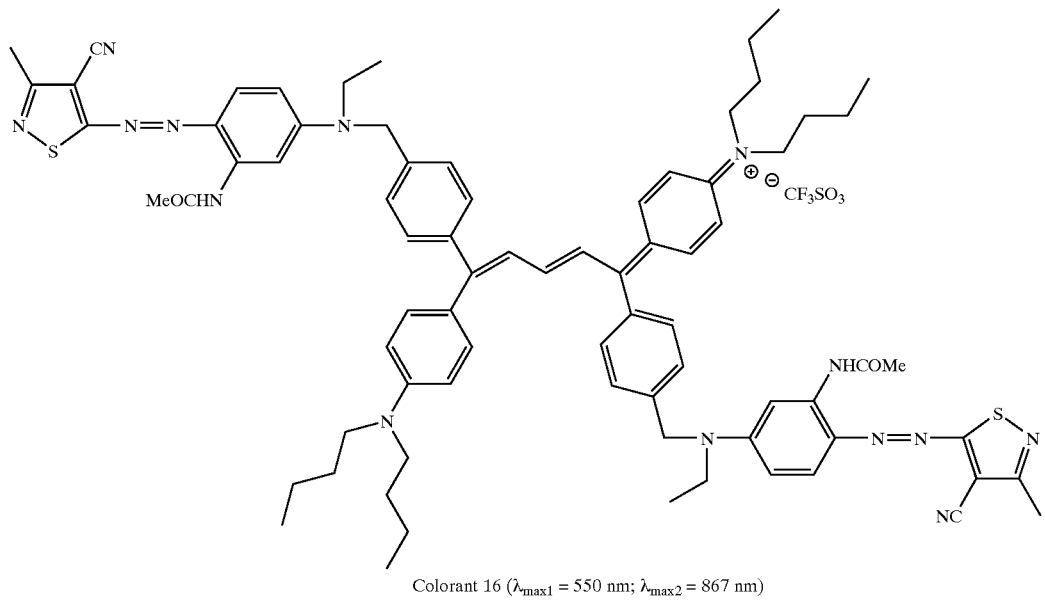
Colorant 16 (λ<sub>max1</sub> = 550 nm; λ<sub>max2</sub> = 867 nm)
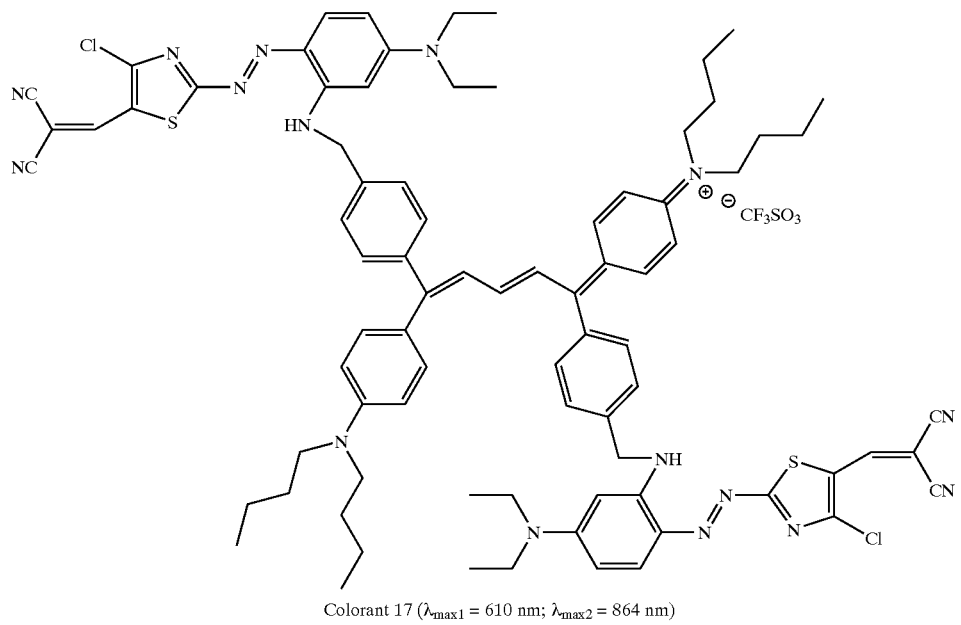
Colorant 17 (λ<sub>max1</sub> = 610 nm; λ<sub>max2</sub> = 864 nm)

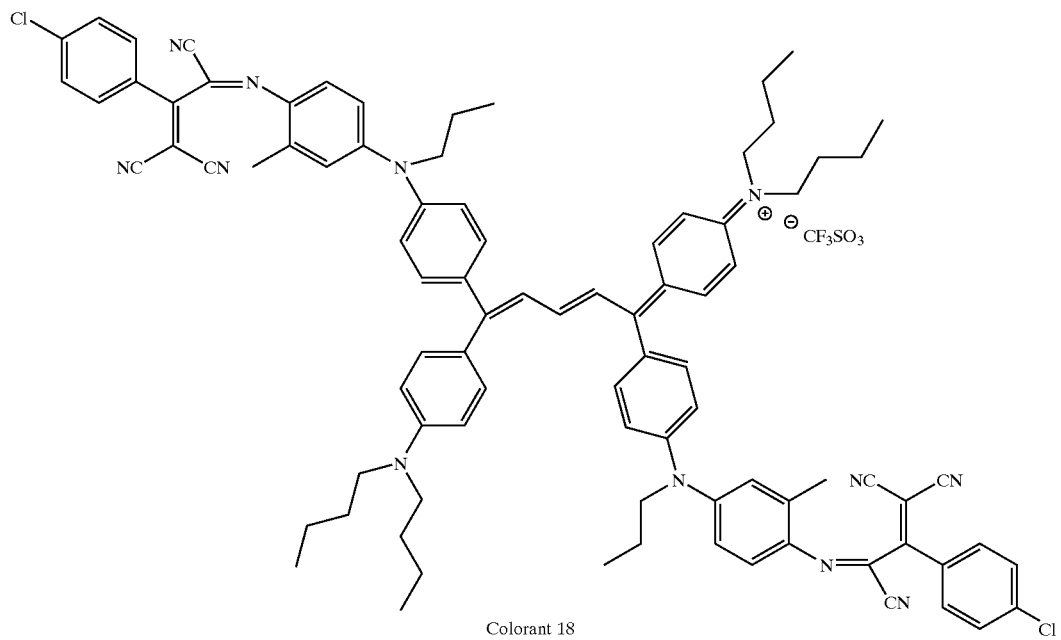
Colorant 18
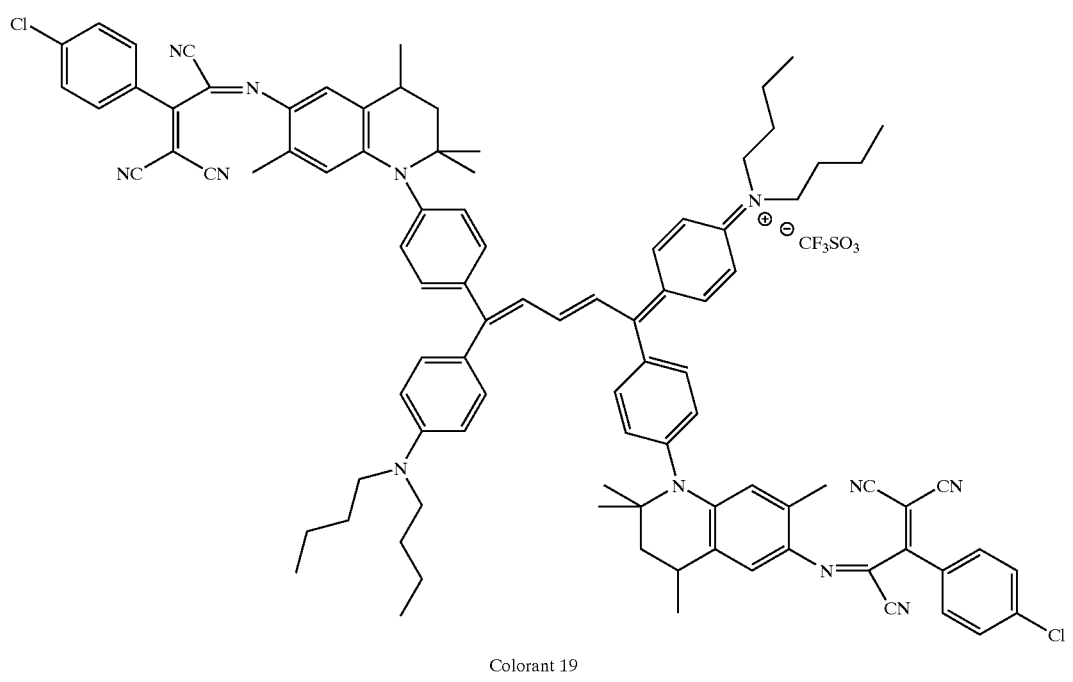
Colorant 19

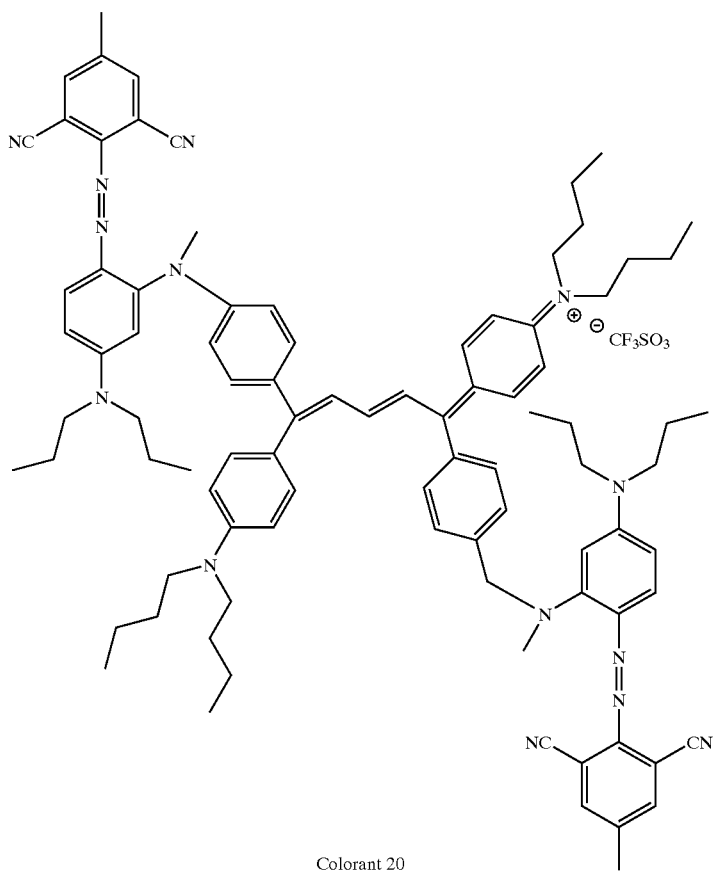
Colorant 20
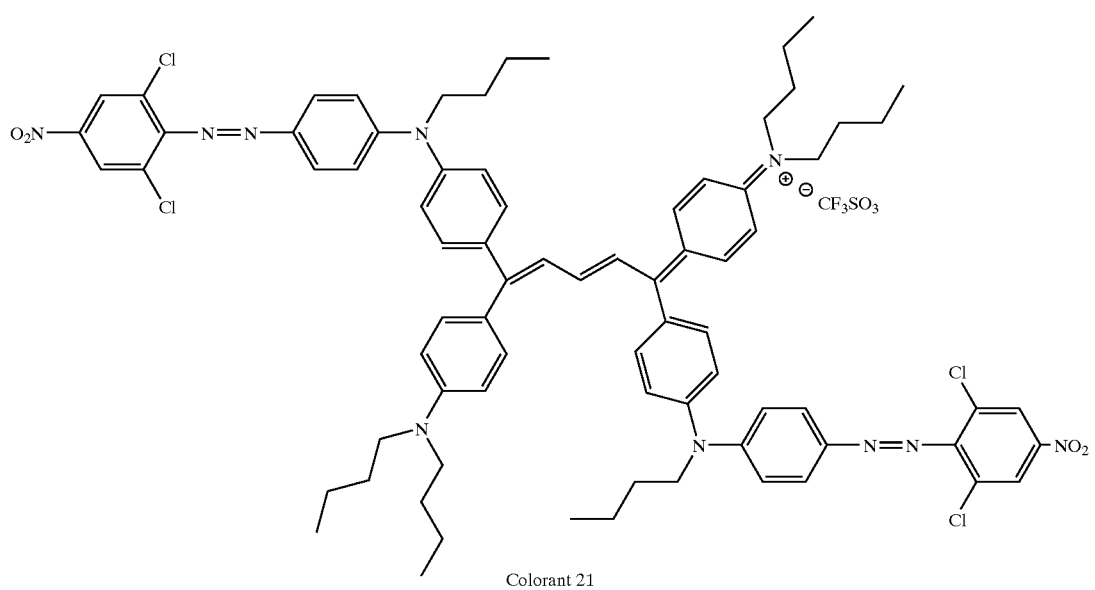
Colorant 21
and

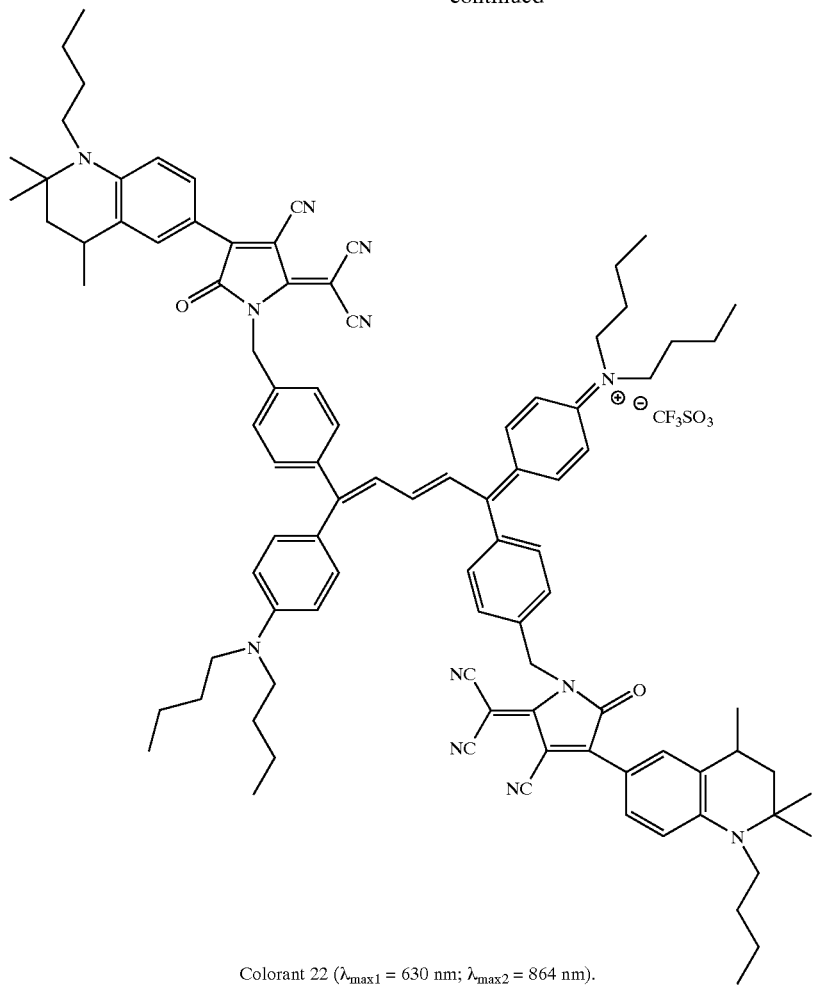
Colorant 22 ($\lambda_{max1}$ = 630 nm; $\lambda_{max2}$ = 864 nm).
* * * * *

UNITED STATES PATENT AND TRADEMARK OFFICE
CERTIFICATE OF CORRECTION

PATENT NO. : 6,841,514 B2
DATED : January 11, 2005
INVENTOR(S) : Charles H. Weidner et al.

It is certified that error appears in the above-identified patent and that said Letters Patent is hereby corrected as shown below:

<u>Columns 65 and 66,</u>
Delete "Colorant 14 chemical structure" and replace with -- Colorant 14 chemical structure noted below --.

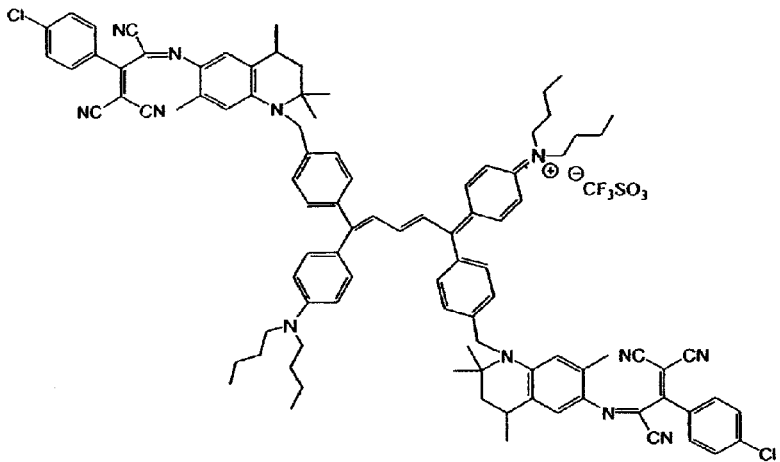

Colorant 14 ($\lambda_{max1}$ = 630 nm; $\lambda_{max2}$ = 861 nm)

Signed and Sealed this

Twenty-ninth Day of November, 2005

JON W. DUDAS
*Director of the United States Patent and Trademark Office*